US012796097B2

(12) United States Patent
Chen

(10) Patent No.: US 12,796,097 B2
(45) Date of Patent: Nov. 10, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Tao Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 390 days.

(21) Appl. No.: 18/566,071

(22) PCT Filed: Sep. 25, 2023

(86) PCT No.: PCT/CN2023/121209
§ 371 (c)(1),
(2) Date: Nov. 30, 2023

(87) PCT Pub. No.: WO2025/010834
PCT Pub. Date: Jan. 16, 2025

(65) Prior Publication Data

US 2025/0022888 A1 Jan. 16, 2025

(30) Foreign Application Priority Data

Jul. 13, 2023 (CN) ......................... 202310862762.1

(51) Int. Cl.
*H01L 27/12* (2006.01)
*H10D 86/40* (2025.01)
*H10D 86/60* (2025.01)

(52) U.S. Cl.
CPC ........... *H10D 86/60* (2025.01); *H10D 86/441* (2025.01)

(58) Field of Classification Search
CPC ....... G09G 3/3208; H01L 27/12; H01L 27/32; H10D 86/60; H10D 86/441
See application file for complete search history.

(56) References Cited

U.S. PATENT DOCUMENTS

2019/0206318 A1* 7/2019 Ding .................. G06V 40/1318
2022/0320243 A1 10/2022 Huang et al.
(Continued)

FOREIGN PATENT DOCUMENTS

CN 107919090 A * 4/2018 ........... G09G 3/3208
CN 111584587 A 8/2020
(Continued)

OTHER PUBLICATIONS

Office Action issued in corresponding Chinese Patent Application No. 202310862762.1, dated Oct. 31, 2024, with English translation, 21 pages provided.
(Continued)

*Primary Examiner* — Ke Xiao
*Assistant Examiner* — Jennifer L Zubajlo
(74) *Attorney, Agent, or Firm* — HSML P.C.

(57) ABSTRACT

Embodiments of the present application disclose a display panel and a display device, the display panel including a substrate and a thin film transistor layer, the thin film transistor layer including a first thin film transistor, a first conductor layer, and a fan-out trace. Orthographic projections of a first fan-out sub-section, a first gate, and a first conductor layer on the substrate at least partially overlap. And a spacing between a first shielding portion and the first gate is greater than a spacing between the first shielding portion and the first fan-out sub-section.

20 Claims, 18 Drawing Sheets

(56) References Cited

U.S. PATENT DOCUMENTS

| | | | | |
|---|---|---|---|---|
| 2023/0060545 | A1* | 3/2023 | Du | G09G 3/3233 |
| 2024/0147785 | A1* | 5/2024 | Wang | G09F 9/33 |
| 2024/0373686 | A1* | 11/2024 | Zhang | G02F 1/1343 |

FOREIGN PATENT DOCUMENTS

| | | | | | |
|---|---|---|---|---|---|
| CN | 114497151 | A | * | 5/2022 | H10K 59/131 |
| CN | 114788009 | A | | 7/2022 | |
| CN | 115064108 | A | | 9/2022 | |
| WO | WO-2024020956 | A1 | * | 2/2024 | H10K 59/131 |

OTHER PUBLICATIONS

International Search Report in International application No. PCT/CN2023/121209, mailed on Mar. 20, 2024, with English translation.

Written Opinion of the International Search Authority in International application PCT/CN2023/121209, mailed on Mar. 20, 2024, with English translation.

* cited by examiner

DISPLAY PANEL AND DISPLAY DEVICE

CROSS-REFERENCE TO RELATED APPLICATIONS

This application is a National Stage of International Application No. PCT/CN2023/121209, filed on Sep. 25, 2023, which claims priority to Chinese Patent Application No. 202310862762.1 filed on Jul. 13, 2023. The disclosures of the aforementioned applications are incorporated herein by reference in their entireties.

TECHNICAL FIELD

The present application relates to display technologies, and more particularly, to a display panel and a display device.

BACKGROUND

The FIAA (Fan-out In Active Area, where fan-out traces are located in a display area) technology may reduce a width of a lower border to a certain extent, in order to reduce a process difficulty and cost. It is possible to select a same metal (such as SD1) for routing the horizontal trace sections of fan-out traces located in a display area and introduced from driver chip terminals as that for data lines in the display area, and select another metal (such as SD2) for routing the vertical trace sections of the fan-out traces located in the display area, so as to reduce cost and realize a concise routing while a signal transmission effect is not changed. However, the display panel thus obtained has overlaps between gates of thin film transistors and fan-out traces in the display area in a thickness direction of the display panel, thereby generating parasitic capacitances, causing interference to data signals Data and resulting in abnormal display.

Accordingly, there is a need for a display panel and a display device to solve the above-mentioned technical problems.

SUMMARY OF THE INVENTION

The present application provides a display panel and a display device, which can alleviate a technical problem of display abnormality caused by overlapping of fan-out traces currently located in a display area and gates of thin film transistors in the display area.

To solve the above problems, the present application provides the following technical solutions.

The present application provides a display panel including a display area, the display panel including:

a substrate;

a thin film transistor layer located on one side of the substrate and including first thin film transistors located in the display area and fan-out traces located in the display area;

wherein each first thin film transistor includes a first gate;

each fan-out trace includes a first fan-out sub-section located on one side of the first gate away from the substrate, an orthographic projection of the first fan-out sub-section on the substrate and an orthographic projection of the first gate on the substrate have a first overlapping portion;

the thin film transistor layer further includes a first conductor layer located between the first gate and the first fan-out sub-section, each first thin film transistor further includes a first shielding portion located in the first conductor layer, an orthographic projection of the first shielding portion on the substrate at least partially overlaps the first overlapping portion; and wherein a spacing between one side of the first shielding portion close to the first gate and one side of the first gate close to the first shielding portion is greater than a spacing between one side of the first shielding portion close to the first fan-out sub-section and one side of the first fan-out sub-section close to the first shielding portion.

Preferably, the first overlapping portion is located in the orthographic projection of the first shielding portion on the substrate.

Preferably, the first shielding portion is electrically connected to a constant voltage signal port of the display panel.

Preferably, a ratio of the spacing between the side of the first shielding portion close to the first gate and the side of the first gate close to the first shielding portion and the spacing between the side of the first shielding portion close to the first fan-out sub-section and the side of the first fan-out sub-section close to the first shielding portion is greater than 1; and the ratio of the spacing between the side of the first shielding portion close to the first gate and the side of the first gate close to the first shielding portion and the spacing between the side of the first shielding portion close to the first fan-out sub-section and the side of the first fan-out sub-section close to the first shielding portion is less than or equal to 5.5.

Preferably, the spacing between the side of the first shielding portion close to the first gate and the side of the first gate close to the first shielding portion is greater than or equal to 300 nm, and the spacing between the side of the first shielding portion close to the first gate and the side of the first gate close to the first shielding portion is less than or equal to 1100 nm; and the spacing between the side of the first shielding portion close to the first fan-out sub-section and the side of the first fan-out sub-section close to the first shielding portion is greater than or equal to 200 nm, and the spacing between the side of the first shielding portion close to the first fan-out sub-section and the side of the first fan-out sub-section close to the first shielding portion is less than or equal to 800 nm.

Preferably, the display panel further including a plurality of data lines located in the display area, the data lines being connected to the first fan-out sub-sections:

each fan-out trace further includes a second fan-out sub-section, the first fan-out sub-section extends in a first direction, the second fan-out sub-section extends in a second direction, each data line extends in the second direction, and the first direction intersects the second direction; and the second fan-out sub-section is located on one side of the first fan-out sub-section away from the substrate.

Preferably, the data lines and the first fan-out sub-sections are disposed in a same layer.

Preferably, the plurality of data lines are connected with the fan-out traces on a one-to-one basis.

Preferably, each first thin film transistor further includes a first active layer and a first source-drain layer, the first active layer is located on the side of the first gate close to the substrate, the first fan-out sub-section and the first source-drain layer are disposed in a same layer;

the thin film transistor layer further includes a first insulating layer and a second insulating layer, the first insulating layer is disposed between the first gate and the first conductor layer, and the second insulating layer is disposed between the first conductor layer and the first fan-out sub-section; and a thickness of the first insulating layer is greater than a thickness of the second insulating layer.

Preferably, the thin film transistor layer further includes second thin film transistors located in the display area, the second thin film transistors being electrically connected to the first thin film transistors; and each second thin film transistor includes a second active layer, a second gate, a third gate, and a second source-drain layer, wherein the second active layer is located on one side of the first active layer away from the substrate, the second gate and the first shielding portion are disposed in a same layer, the second source-drain layer and the first source-drain layer are disposed in a same layer, and the third gate is located on one side of the second active layer close to the substrate.

Preferably, the first insulating layer includes a first insulating sub-layer, a second insulating sub-layer, and a third insulating sub-layer, the first insulating sub-layer being located between the first gate and the third gate, the second insulating sub-layer being located between the third gate and the second active layer, and the third insulating sub-layer being located between the second active layer and the first conductor layer.

Preferably, the display panel further including a light-emitting device layer on one side of the first source-drain layer away from the substrate, the light-emitting device layer including a light-emitting device including an anode; and the display panel further includes a second conductor layer located between the first source-drain layer and the light-emitting device layer, the second conductor layer including a transition portion, the anode being connected to the transition portion, the first source-drain layer including a first source and a first drain, and the transition portion being connected to the first source or the first drain.

Preferably, wherein the second fan-out sub-sections of the fan-out traces are located in the second conductor layer.

Preferably, the thin film transistor layer includes a first-type thin film transistor, a second-type thin film transistor, a third-type thin film transistor, a fourth-type thin film transistor, a fifth-type thin film transistor, a sixth-type thin film transistor, a seventh-type thin film transistor, and an eighth-type thin film transistor located in the display area;

a source and a drain of the first-type thin film transistor are electrically connected between a second node and a third node, and a gate of the first-type thin film transistor is electrically connected to a first node;

one of a source and a drain of the second-type thin film transistor is electrically connected to the second node, the other of the source and the drain of the second-type thin film transistor receives a data signal, and a gate of the second-type thin film transistor receives a first scan signal;

a source and a drain of the third-type thin film transistor are electrically connected between the first node and the third node, and a gate of the third-type thin film transistor receives a second scan signal;

one of a source and a drain of the fourth-type thin film transistor is electrically connected to the first node, the other of the source and the drain of the fourth-type thin film transistor receives a first reset signal, and a gate of the fourth-type thin film transistor receives a third scan signal;

a source and a drain of the fifth-type thin film transistor are electrically connected between a first power supply terminal and the second node, and a gate of the fifth-type thin film transistor receives a light-emitting control signal;

a source and a drain of the sixth-type thin film transistor are electrically connected between the third node and a light-emitting device, and a gate of the sixth-type thin film transistor receives the light-emitting control signal;

one of a source and a drain of the seventh-type thin film transistor is electrically connected to the light-emitting device, the other of the source and the drain of the seventh-type thin film transistor receives a second reset signal, and a gate of the seventh-type thin film transistor receives a fourth scan signal;

one of a source and a drain of the eighth-type thin film transistor is electrically connected to the second node, the other of the source and the drain of the eighth-type thin film transistor receives a third reset signal, and a gate of the eighth-type thin film transistor receives a fifth scan signal; and wherein at least one of the seventh-type thin film transistor or the eighth-type thin film transistor is selected from the first thin film transistors and at least one of the third-type thin film transistor or the fourth-type of thin film transistor is selected from the second thin film transistors.

Preferably, one of the source and the drain of the eighth-type thin film transistor is electrically connected to the second node, the other of the source and the drain of the eighth-type thin film transistor is electrically connected to a third reset line, and the third reset line is configured to transmit a third reset signal; and the third reset line and the first shielding portion are disposed in a same layer.

The present application further provides a display device including a display panel, the display panel including:

a substrate;

a thin film transistor layer located on one side of the substrate and including first thin film transistors located in the display area and fan-out traces located in the display area;

wherein each first thin film transistor includes a first gate;

each fan-out trace includes a first fan-out sub-section located on one side of the first gate away from the substrate, an orthographic projection of the first fan-out sub-section on the substrate and an orthographic projection of the first gate on the substrate have a first overlapping portion;

the thin film transistor layer further includes a first conductor layer located between the first gate and the first fan-out sub-section, each first thin film transistor further includes a first shielding portion located in the first conductor layer, an orthographic projection of the first shielding portion on the substrate at least partially overlaps the first overlapping portion; and wherein a spacing between one side of the first shielding portion close to the first gate and one side of the first gate close to the first shielding portion is greater than a spacing between one side of the first shielding portion close to the first fan-out sub-section and one side of the first fan-out sub-section close to the first shielding portion.

Preferably, the first overlapping portion is located in the orthographic projection of the first shielding portion on the substrate.

Preferably, the first shielding portion is electrically connected to a constant voltage signal port of the display panel.

Preferably, a ratio of the spacing between the side of the first shielding portion close to the first gate and the side of the first gate close to the first shielding portion and the spacing between the side of the first shielding portion close to the first fan-out sub-section and the side of the first fan-out sub-section close to the first shielding portion is greater than 1; and the ratio of the spacing between the side of the first shielding portion close to the first gate and the side of the first gate close to the first shielding portion and the spacing between the side of the first shielding portion close to the first fan-out sub-section and the side of the first fan-out sub-section close to the first shielding portion is less than or equal to 5.5.

Preferably, the spacing between the side of the first shielding portion close to the first gate and the side of the first gate close to the first shielding portion is greater than or equal to 300 nm, and the spacing between the side of the first shielding portion close to the first gate and the side of the first gate close to the first shielding portion is less than or equal to 1100 nm; and the spacing between the side of the first shielding portion close to the first fan-out sub-section and the side of the first fan-out sub-section close to the first shielding portion is greater than or equal to 200 nm, and the spacing between the side of the first shielding portion close to the first fan-out sub-section and the side of the first fan-out sub-section close to the first shielding portion is less than or equal to 800 nm.

According to the present application, the parasitic capacitance between the first gate and the first fan-out sub-section is reduced by the arrangement of the first shielding portion. And the spacing between the first gate and one side of the first shielding portion close to the first gate is set larger, so that the parasitic capacitance between the first shielding portion and the first gate is prevented from interfering with the signal received by the first gate, thereby improving the display quality of the display panel.

DETAILED DESCRIPTION EMBODIMENTS OF THE INVENTION

The present application provides a display panel and a display device, in order to make the object, technical solution and effect of the present application clearer and more specific, the present application will be described in further detail below with reference to the accompanying drawings and embodiments. It is to be understood that the specific embodiments described herein are merely illustrative of the present application and are not intended to limit the present application.

Figure 1:
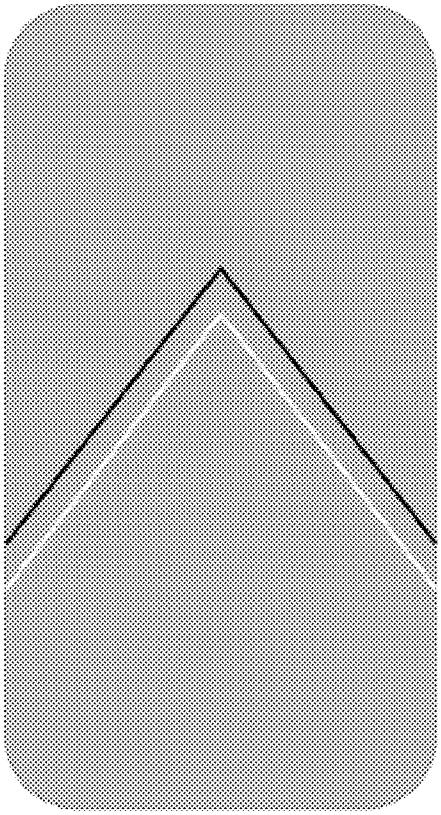
FIG. 1 is a schematic diagram of display abnormality of a display panel in the prior art.

Referring to FIG. 1, at present, the FIAA technology allows fan-out traces to be provided in a display area, and the fan-out traces overlap gates of thin film transistors in the display area in a thickness direction of the display panel, so that parasitic capacitance generated cause interference to data signals Data, and there is a technical problem of display abnormality of the display panel.

Referring to FIGS. 4-18, an embodiment of the present application provides a display panel 100 including a display area AA, the display panel 100 including:

a substrate 101;

a thin film transistor layer 102 located on one side of the substrate 101, including a first thin film transistor 103 located in the display area AA and a fan-out trace 104 located in the display area AA;

the first thin film transistor 103 includes a first gate 105;

the fan-out trace 104 includes a first fan-out sub-section 106 located on one side of the first gate 105 away from the substrate 101, there is a first overlapping portion 109 between an orthographic projection of the first fan-out sub-section 106 on the substrate 101 and an orthographic projection of the first gate 105 on the substrate 101;

the thin film transistor layer 102 further includes a first conductor layer 107 located between the first gate 105 and the first fan-out sub-section 106, and the first thin film transistor 103 further includes a first shielding portion 108 located in the first conductor layer 107, an orthographic projection of the first shielding portion 108 on the substrate 101 at least partially overlaps with the first overlapping portion 109;

wherein a spacing between one side of the first shielding portion 108 close to the first gate 105 and one side of the first gate 105 close to the first shielding portion 108 is greater than a spacing between one side of the first shielding portion 108 close to the first fan-out sub-section 106 and one side of the first fan-out sub-section 106 close to the first shielding portion 108.

According to the embodiment of the present application, the parasitic capacitance between the first gate 105 and the first fan-out sub-section 106 is improved by the arrangement of the first shielding portion 108. At the same time, the spacing between the side of the first shielding portion 108 close to the first gate 105 and the first gate 105 is set larger, so that a signal received by the first gate 105 is protected from being interfered with by the parasitic capacitance between the first shielding portion 108 and the first gate 105, thereby improving a display quality of the display panel 100.

The technical solutions of the present application will now be described in connection with specific embodiments.

Figure 4:
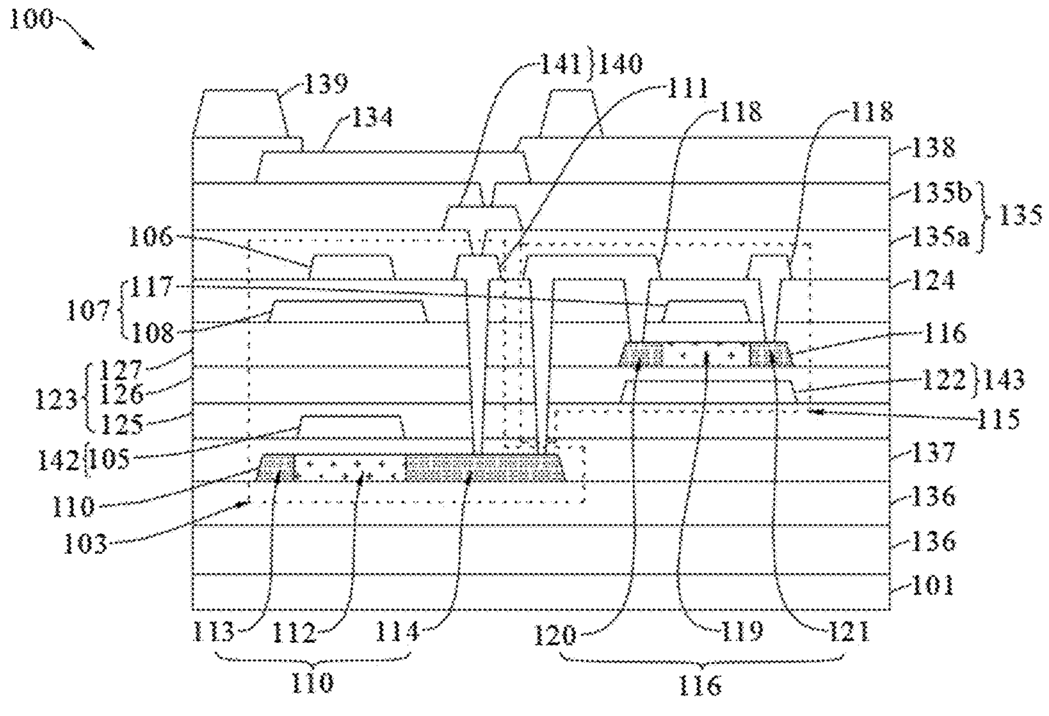
FIG. 4 is a diagram showing a first structure of a display panel according to an embodiment of the present application.
Figure 5:
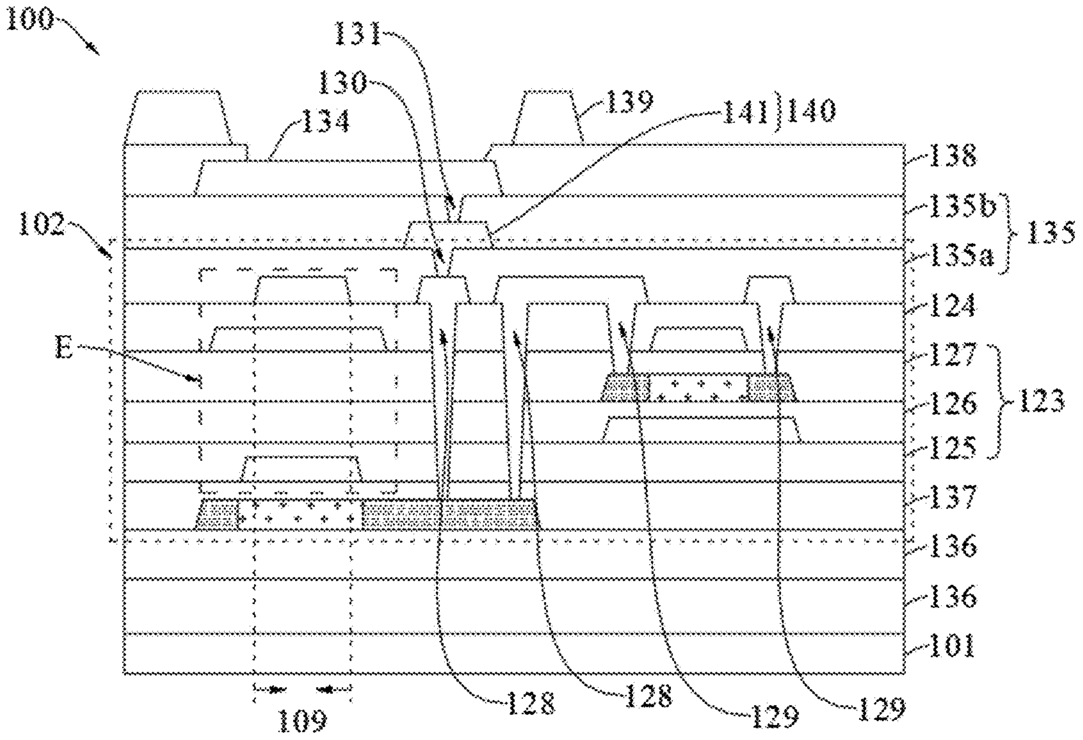
FIG. 5 is a diagram showing a second structure of a display panel according to an embodiment of the present application.
Figure 6:
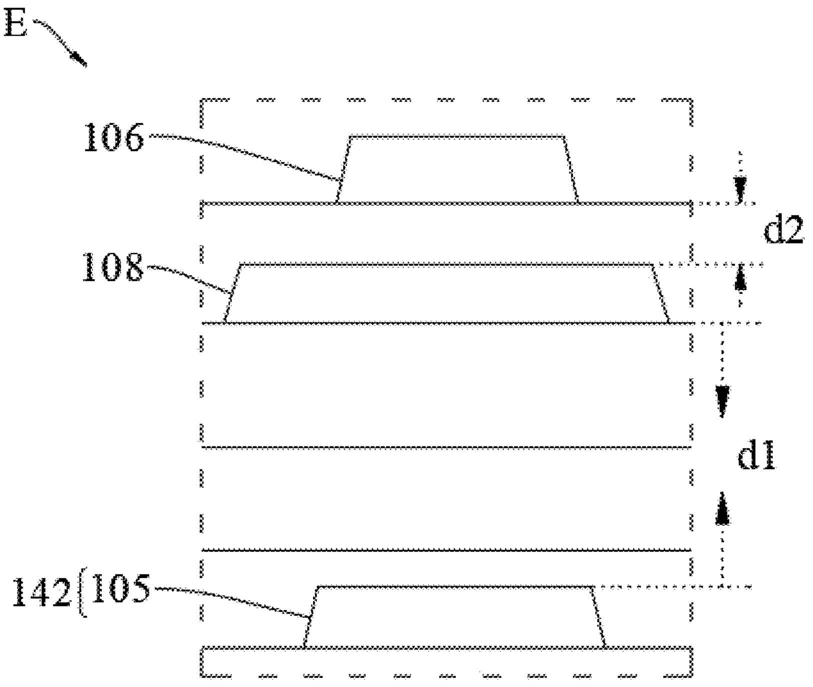
FIG. 6 is a schematic diagram showing structure of an area E in FIG. 5.

Referring to FIGS. 4 to 6, in this embodiment, the first thin film transistor 103 includes a first active layer 110, a first gate 105, and a first source-drain layer 111. In this case, the first active layer 110 is located on one side of the first gate 105 close to the substrate 101, and the first source-drain layer 111 is located on one side of the first gate 105 away from the substrate 101.

The first source-drain layer 111 may include a first source and a first drain, the first source and the first drain being connected to the first active layer 110, respectively.

The first active layer 110 includes a first channel portion 112, and a first conductor portion 113 and a second conductor portion 114 on opposite sides of the first channel portion 112. The first source is connected to the first conductor portion 113, and the first drain is connected to the second conductor portion 114.

In some embodiments, the orthographic projection of the first channel portion 112 on the substrate 101 is located within the orthographic projection of the first gate 105 on the substrate 101.

In some embodiments, the first thin film transistor 103 may be a polysilicon thin film transistor, e.g., a low temperature polysilicon thin film transistor, and a material of the first active layer 110 includes a polysilicon material.

Referring to FIGS. 4-6, and FIG. 14, in some embodiments, the first fan-out sub-section 106 and the first source-drain layer 111 are disposed in the same layer of the first metal layer 144 to simplify the process and reduce process costs.

Referring to FIG. 6, in some embodiments, the orthographic projection of the first fan-out sub-section 106 on the substrate 101 and the orthographic projection of the first gate 105 on the substrate 101 have a first overlapping portion 109 located within the orthographic projection of the first shielding portion 108 on the substrate 101, so that the first shielding portion 108 can maximally shield the signal crosstalk between the first gate 105 and the first fan-out sub-section 106, reduce the parasitic capacitance between the first gate 105 and the first fan-out sub-section 106, and improve display quality of the display panel 100.

In some embodiments, a thin film transistor of the thin film transistor layer 102 located within the display area AA may consist of the first thin film transistor 103.

Referring to FIGS. 4 and 5, in some embodiments, the thin film transistor layer 102 further includes a second thin film transistor 115 electrically connected to the first thin film transistor 103. The second thin film transistor 115 includes a second active layer 116, a second gate 117, and a second source-drain layer 118. In this case, the second active layer 116 is located on one side of the first active layer 110 away from the substrate 101, the second gate 117 is located on one side of the second active layer 116 away from the substrate 101, and the second source-drain layer 118 is located on one side of the second gate 117 away from the substrate 101.

Figure 13:
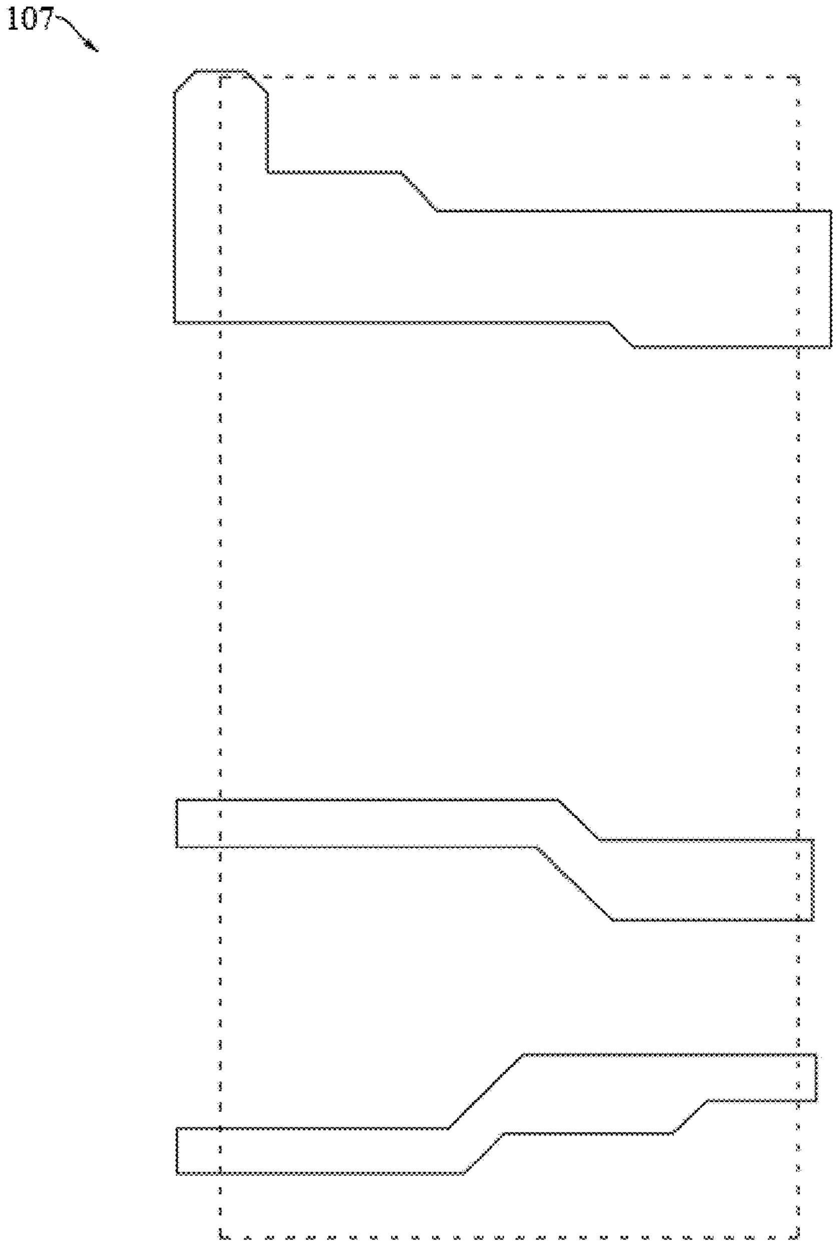
FIG. 13 is a schematic diagram showing structure of a first conductor layer of film layers of a display panel according to an embodiment of the present application.

Referring to FIGS. 4 to 5, and FIG. 13, the second gate 117 may be disposed in the same layer as the first shielding portion 108, that is, the second gate 117 may be located in the first conductor layer 107. The second source-drain layer 118 may be disposed in the same layer as the first source-drain layer 111 in order to simplify the process and reduce the manufacturing cost of the display panel 100. When the first fan-out sub-section 106 is disposed in the same layer as the first source-drain layer 111, the first fan-out sub-section 106, the first source-drain layer 111, and the second source-drain layer 118 are disposed in the same layer.

The second source-drain layer 118 may include a second source and a second drain, the second source and the second drain being connected to the second active layer 116, respectively.

The second active layer 116 includes a second channel portion 119 and a third conductor portion 120 and a fourth conductor portion 121 on opposite sides of the second channel portion 119. The second source is connected to the third conductor portion 120, and the second drain is connected to the fourth conductor portion 121.

Referring to FIGS. 4 and 5, in some embodiments, the second source-drain layer 118 is connected to the first active layer 110 to effect electrical connection of the first thin film transistor 103 to the second thin film transistor 115. Specifically, the second source is connected to the second conductor portion 114 of the first active layer 110, or the second drain is connected to the first conductor portion 113 of the first active layer 110, so that the first thin film transistor 103 is electrically connected to the second thin film transistor 115.

In some embodiments, the second thin film transistor 115 may be of a different type than the first thin film transistor 103. The second thin film transistor 115 may be a metal oxide transistor, and the second active layer 116 includes a metal oxide material, such as indium gallium zinc oxide, or the like.

Referring to FIGS. 4 and 5, in some embodiments, the second thin film transistor 115 further includes a third gate 122 located on one side of the second active layer 116 close to the substrate 101, the third gate 122 and the second gate 117 forming a dual-gate structure, and the second thin film transistor 115 may be a dual-gate transistor. The orthographic projection of the second active layer 116 on the substrate 101 may be located within the orthographic projection of the third gate 122 on the substrate 101. The third gate 122 is located between the second active layer 116 and the substrate 101, and serves to block light from irradiating from the substrate 101 to the second active layer 116 of the second thin film transistor 115 to affect an operation performance of the second thin film transistor 115. The third gate 122 is located in the third conductor layer 143 of the thin film transistor layer 102.

Referring to FIGS. 4 and 5, in some embodiments, the thin film transistor layer 102 further includes a first insulating layer 123 disposed between the first gate 105 and the first conductor layer 107 and a second insulating layer 124 disposed between the first conductor layer 107 and the first fan-out sub-section 106. When the first fan-out sub-section 106 is disposed on the same layer with the first source-drain layer 111 and the second source-drain layer 118, the second insulating layer 124 is also disposed between the first conductor layer 107 and the first source-drain layer 111, and between the first conductor layer 107 and the second source-drain layer 118. Specifically, the second insulating layer 124 is disposed between the first shielding portion 108 and the first fan-out sub-section 106, between the first shielding portion 108 and the first source/drain layer 111, and between the second gate 117 and the second source-drain layer 118. Since the spacing between the side of the first shielding portion 108 close to the first gate 105 and the side of the first gate 105 close to the first shielding portion 108 is larger than the spacing between the side of the first shielding portion 108 close to the first fan-out sub-section 106 and the side of the first fan-out sub-section 106 close to the first shielding portion 108, a thickness of the first insulating layer 123 is larger than a thickness of the second insulating layer 124.

The material of the first insulating layer 123 and the second insulating layer 124 is selected from at least one of silicon oxide and silicon nitride.

The second insulating layer 124 may be a single layer formed of a single insulating material, or may be a single layer formed of a mixture of multiple insulating materials.

When the thin film transistor of the thin film transistor layer 102 located in the display area AA may consist of the first thin film transistor 103, the first insulating layer 123 may be a single layer formed of a single insulating material, a single layer formed of a mixture of a plurality of insulating materials, or a plurality of layers formed of alternating insulating materials.

When the thin film transistor layer 102 located in the display area AA includes the first thin film transistor 103 and the second thin film transistor 115, the first insulating layer 123 includes a first insulating sub-layer 125 located between the first gate 105 and the third gate 122, a second insulating sub-layer 126 located between the third gate 122 and the second active layer 116, and a third insulating sub-layer 127 located between the second active layer 116 and the first conductor layer 107.

In some embodiments, the thin film transistor layer 102 further includes a third insulating layer 137 located between the first active layer 110 and the first gate 105, the third insulating layer 137 overlying the first active layer 110.

Figure 16:
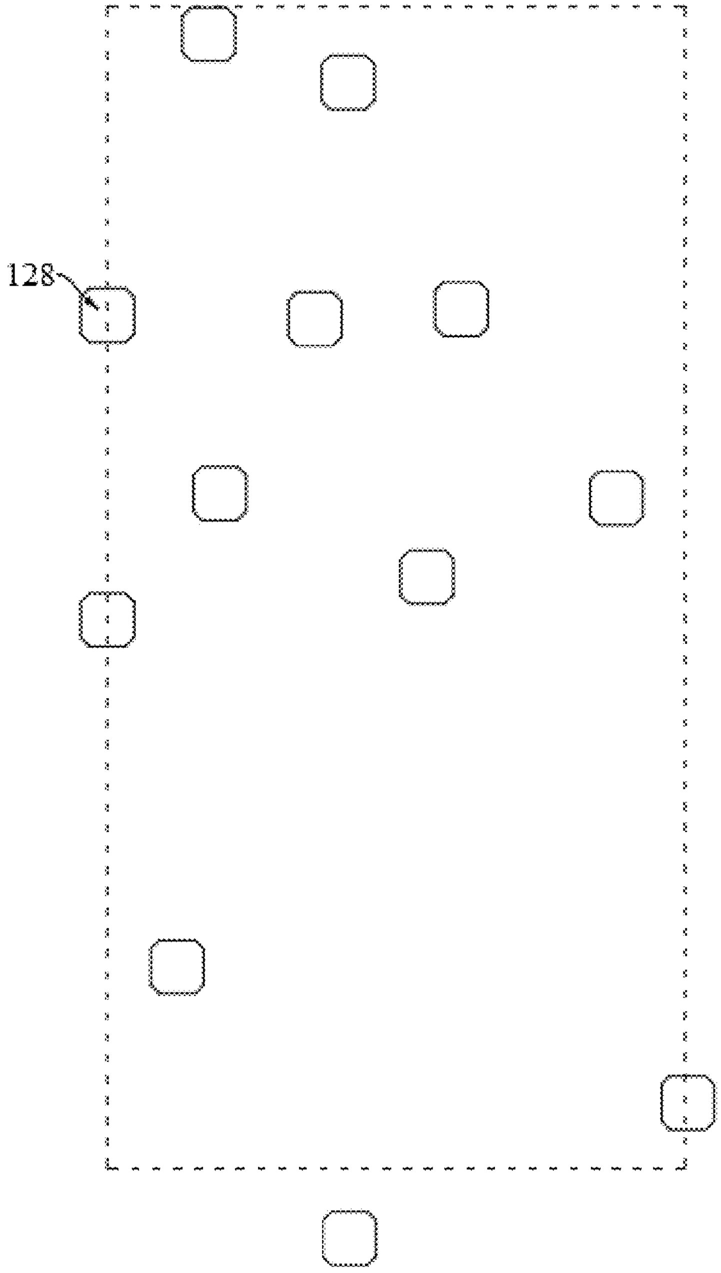
FIG. 16 is a schematic diagram showing structure of first via holes of a display panel according to an embodiment of the present application.

Referring to FIGS. 4-5, and FIG. 16, in some embodiments, the thin film transistor layer 102 further includes a plurality of first via holes 128 running through the first insulating layer 123, the second insulating layer 124, and the third insulating layer 137. The first source-drain layer 111 is connected to the first active layer 110 through the first via holes 128. The plurality of the first via holes 128 are respectively located on opposite sides of the first channel portion 112 and expose the first conductor portion 113 and the second conductor portion 114, and the first source extends through a first via hole 128 and is in contact with the first conductor portion 113 so as to be connected to the first active layer 110. The first drain extends through a first via hole 128 and is in contact with the second conductor portion 114 so as to be connected to the first active layer 110.

Figure 17:
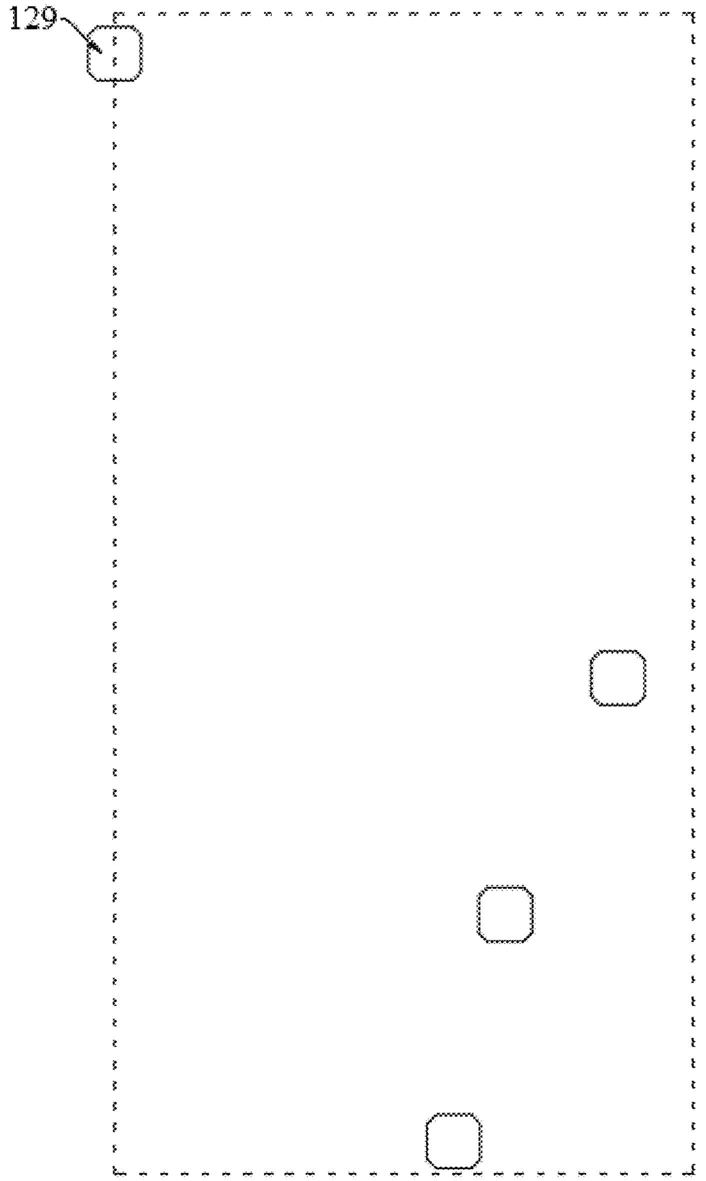
FIG. 17 is a schematic diagram showing structure of second via holes of a display panel according to an embodiment of the present application.
Figure 18:
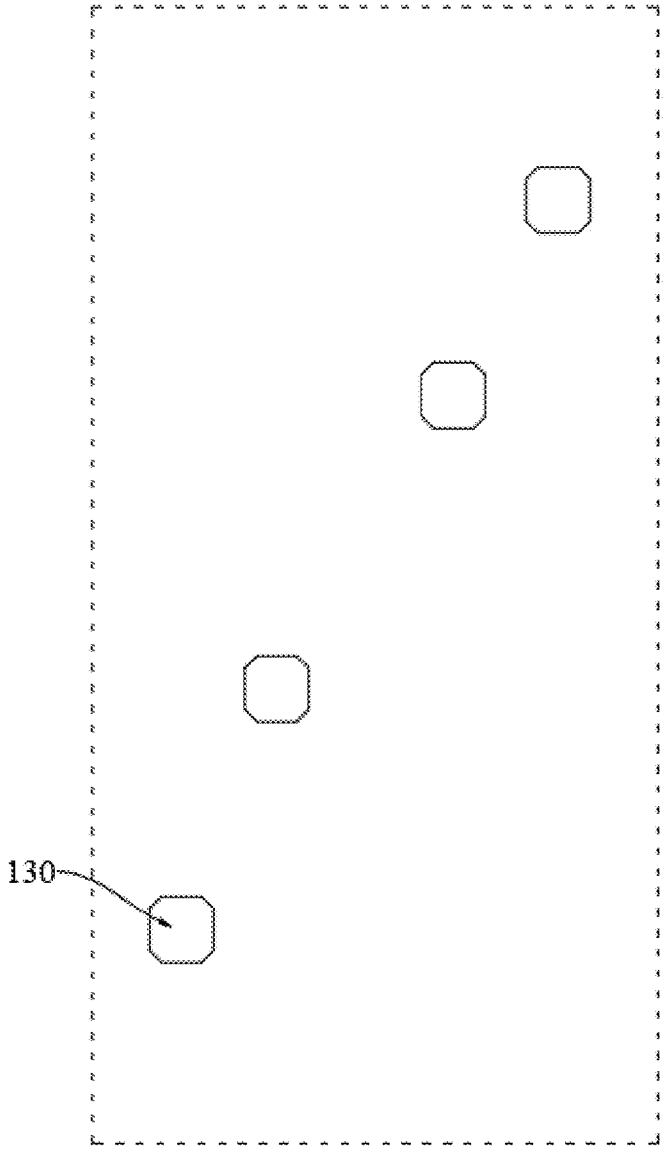
FIG. 18 is a schematic diagram showing structure of third via holes of a display panel according to an embodiment of the present application.

Referring to FIGS. 4-5, and FIG. 17, in some embodiments, when the thin film transistor layer 102 further includes the second thin film transistor 115, the thin film transistor layer 102 further includes a plurality of second via holes 129 running through the second insulating layer 124 and the third insulating sub-layer 127. The second source-drain layer 118 is connected to the second active layer 116 through the second via holes 129. The plurality of the second via holes 129 are respectively located on opposite sides of the second channel portion 119 and expose the third conductor portion 120 and the fourth conductor portion 121. The second source extends through a second via hole 129 and is in contact with the third conductor portion 120 so as to be connected to the second active layer 116, and the second drain extends through a second via hole 129 and is in contact with the fourth conductor portion 121 so as to be connected to the second active layer 116.

Referring to FIGS. 4 to 5, and FIG. 16, in some embodiments, when the second source-drain layer 118 is connected to the first active layer 110, for example, when the second source is connected to the second conductor portion 114 of the first active layer 110, or when the second drain is connected to the first conductor portion 113 of the first active layer 110, there also are first via holes 128 located on one side of the first channel portion 112 close to the second thin film transistor 115, and exposing the first conductor portion 113 or the second conductor portion 114, and the second source-drain layer 118 extends into the first via holes 128 and is connected to the first conductor portion 113 or the second conductor portion 114 of the second active layer 116. When the second source is connected to the second conductor portion 114, the second source extends through a first via hole 128 and is in contact with the second conductor portion 114, thereby realizing electrical connection with the first thin film transistor 103. When the second drain is connected to the second conductor portion 114, the second drain extends through a first via hole 128 and is in contact with the first conductor portion 113, thereby realizing electrical connection with the first thin film transistor 103.

In some embodiments, the display panel 100 further includes a light-emitting device layer located on one side of the first source-drain layer 111 away from the substrate 101. The light-emitting device layer includes a light-emitting device including an anode 134 connected to the first source or the first drain.

In some embodiments, the light-emitting device includes the anode 134, a light-emitting layer, and a cathode in a direction from the substrate 101 to the thin film transistor layer 102. In the direction from the anode 134 to the cathode, the light-emitting layer includes a hole-transporting layer (e.g., a hole-injecting layer, a hole-transporting layer), a light-emitting material layer, and an electron-transporting layer (e.g., an electron-transporting layer, an electron-injecting layer).

Figure 15:
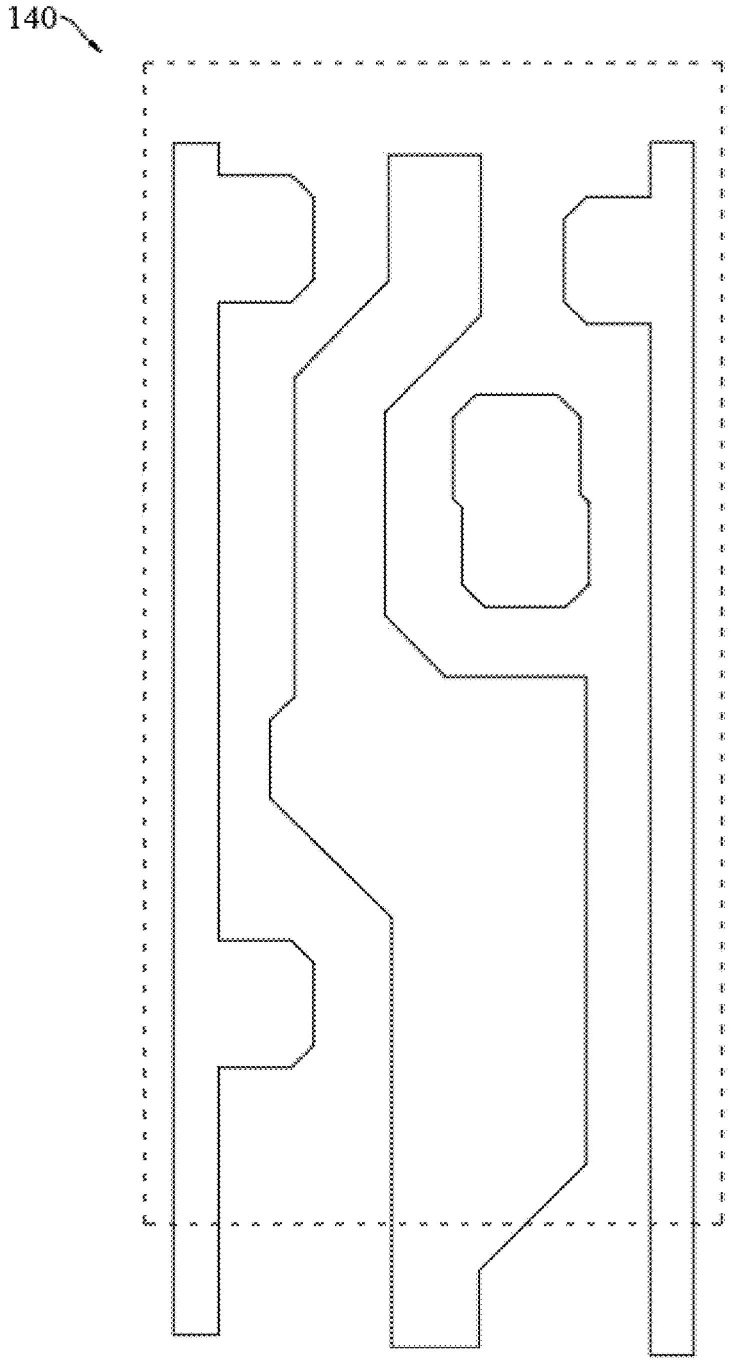
FIG. 15 is a schematic diagram showing structure of a second conductor layer of film layers of a display panel according to an embodiment of the present application.

Referring to FIGS. 4 to 5, and FIG. 15, in some embodiments, the display panel 100 further includes a second conductor layer 140 between the first source-drain layer 111 and the light-emitting device layer. The second conductor layer 140 includes a transition portion 141, the anode 134 is connected to the transition portion 141, and the transition portion 141 is connected to the first source or the first drain, thereby enabling connection of the anode 134 to the first source or the first drain.

In some embodiments, the material(s) of the first gate 105, the first conductor layer 107, the fan-out trace 104, the third gate 122, the second conductor layer 140, the first source-drain layer 111, the second source-drain layer 118 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), for example, may be a combination of Ti/Cu/Ti, Ti/Ag/Ti, Ti/Al/Ti, or Mo/Al/Mo.

In some embodiments, the display panel 100 further includes a planarization layer 135 between the first source-drain layer 111 and the light-emitting device layer. The planarization layer 135 may be of a material selected from at least one of tetraethylorthosilicate (TEOS), silicon nitride, silicon oxide, organic material (e.g., polyimide, etc.) having a low dielectric constant.

Referring to FIGS. 4 to 5, and FIGS. 17 to 18, the planarization layer 135 may include a first planarization sub-layer 135*a* between the second conductor layer 140 and the first source-drain layer 111, and a second planarization sub-layer 135*b* between the second conductor layer 140 and the anode 134. The planarization layer 135 includes a third via hole 130 running through the first planarization sub-layer 135*a* and exposing the first source-drain layer 111, and a fourth via 131 running through the second planarization sub-layer 135*b* and exposing the transition portion 141. The anode 134 extends into the fourth via hole 131 and is connected to the transition portion 141, which extends into the third via hole 130 and is connected to the first source-drain layer 111. Specifically, the transition portion 141 extends into the third via hole 130 and is connected to the first source or the first drain.

Figure 7:
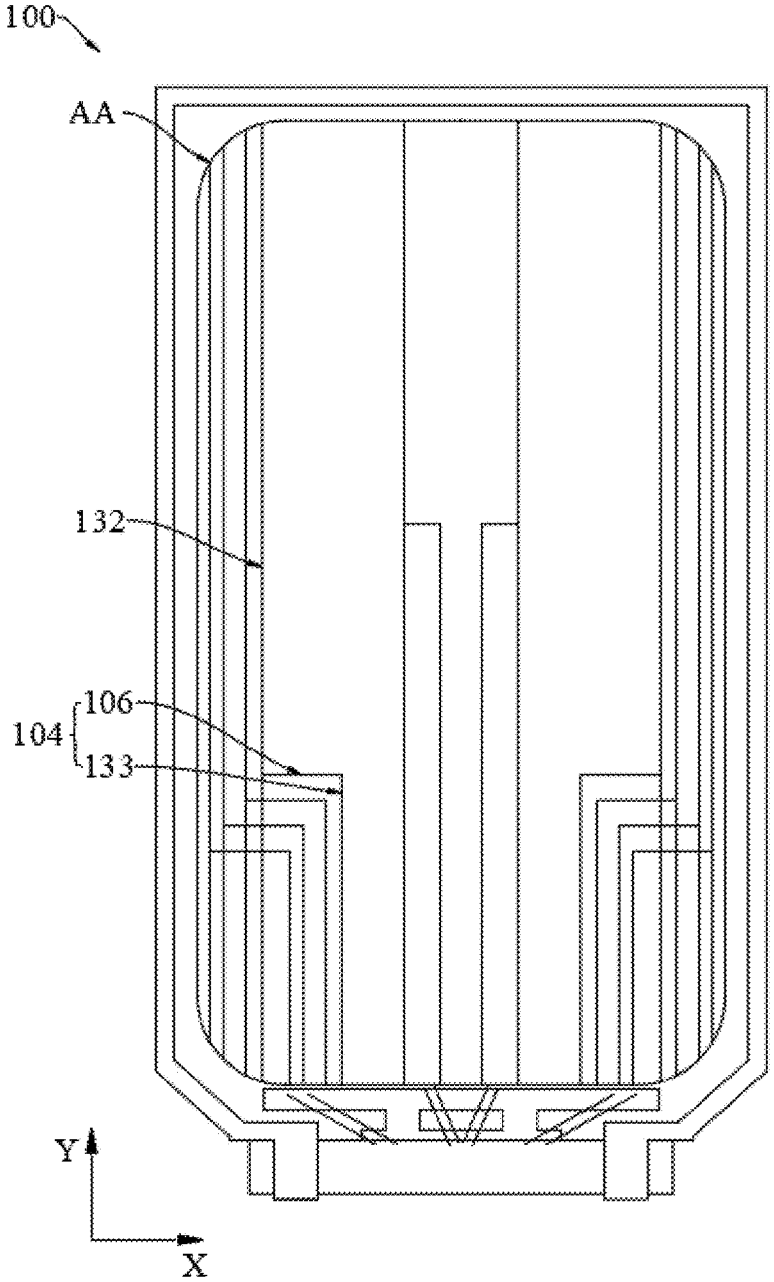
FIG. 7 is a diagram showing a third structure of a display panel according to an embodiment of the present application.

Referring to FIG. 7, in some embodiments, the display panel 100 further includes a plurality of data lines 132 located within the display area AA. The data lines 132 are connected to the first fan-out sub-sections 106. The data lines 132 may be disposed in the same layer of the first metal layer 144 as the first fan-out sub-sections 106 to facilitate connection of the data lines 132 to the first fan-out sub-sections 106. When the first fan-out sub-sections 106, the data lines 132, the first source-drain layer 111, and the second source-drain layer 118 are disposed in the same layer, the data signals Data are transmitted from the first fan-out sub-sections 106 to the data lines 132 and then from the data lines 132 to the first source-drain layer 111 and/or the second source-drain layer 118.

Referring to FIG. 7, in some embodiments, the fan-out traces 104 each further include a second fan-out sub-section 133. The first fan-out sub-sections 106 extend in a first direction X, and the second fan-out sub-sections 133 extend in a second direction Y. The first direction X intersects the second direction Y. The data lines 132 extend in the second direction Y, and the data lines 132 are spaced apart in the first direction X. Each fan-out trace 104 includes a first fan-out sub-section 106 and a second fan-out sub-section 133, i.e., each fan-out trace 104 is disposed in a bent configuration. The data lines 132 may be disposed in the same layer with the second fan-out sub-sections 133, and the extension direction of the data lines 132 is the same as the extension direction of the second fan-out sub-sections 133. The data lines 132 being disposed in the same layer with the second fan-out sub-sections 133 and having same extension direction as the second fan-out sub-sections 133 facilitates spatial arrangement, simplifies a manufacturing process of the display panel 100, and reduces the manufacturing cost.

In some embodiments, the first direction X and the second direction Y may be directions perpendicular to each other, for example, the first direction X may be a horizontal direction and the second direction Y may be a vertical direction. Specifically, the first direction X may be a width direction of the display panel 100, and the second direction Y may be a length direction of the display panel 100.

Referring to FIG. 7, in some embodiments, the plurality of the data lines 132 and the plurality of the fan-out traces 104 are connected on a one-to-one basis, i.e., one of the data lines 132 is connected to one of the fan-out traces 104. The first fan-out sub-sections 106 of the plurality of fan-out traces 104 are spaced apart in the second direction Y, and the second fan-out sub-sections 133 of the plurality of fan-out traces 104 are spaced apart in the first direction X.

In some embodiments, the second fan-out sub-sections 133 are located on one side of the first fan-out sub-sections 106 away from the substrate 101. The second fan-out sub-sections 133 may be located in the second conductor layer 140, that is, the second fan-out sub-sections 133 may be disposed in the same layer with the transition portion 141, so as to simplify the processing process and reduce the processing cost. The first fan-out sub-sections 106 are connected to the second fan-out sub-sections 133 through via holes located in the first planarization sub-layer 135*a*.

In some embodiments, there is a driver chip (Integrated Circuit, IC for short) on one side of the display area AA, and ends of the fan-out traces 104 close to the driver chip are electrically connected to the driver chip to acquire corresponding data signals Data and transfer the data signals to the data lines 132.

In some embodiments, the display panel 100 further includes a bonding area between the driver chip and the display area AA. The display panel 100 further includes connection lines located within the bonding area, one end of each connection line being connected to a fan-out trace 104, and the other end of the connection line being connected to the driver chip in a bonding manner.

Figure 2:
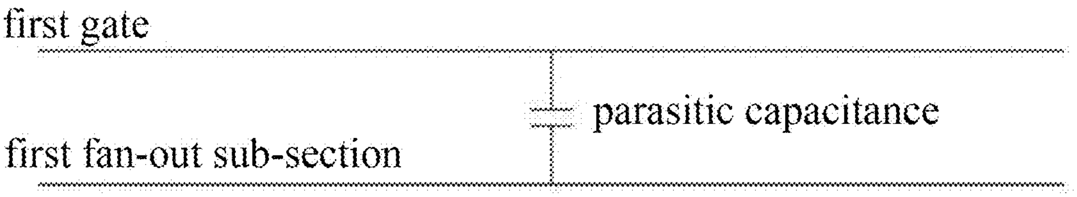
FIG. 2 is a first schematic diagram showing principle of a display abnormality of a display panel in the prior art.
Figure 3:
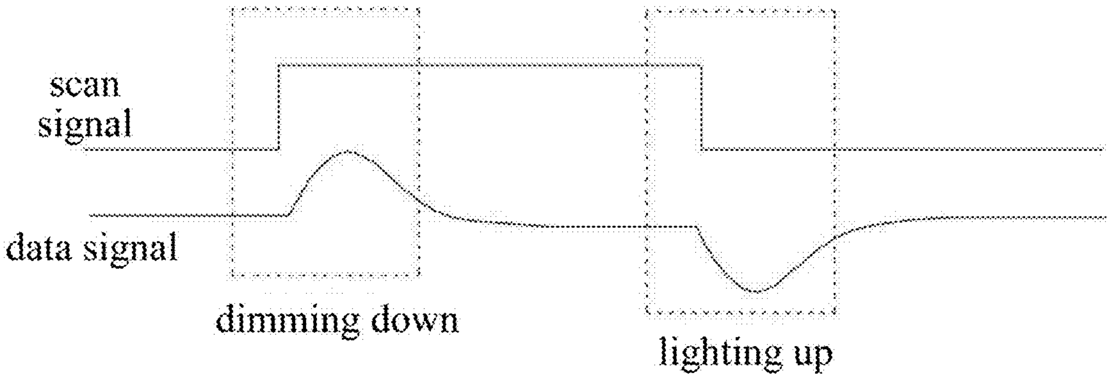
FIG. 3 is a second schematic diagram showing principle of a display abnormality of a display panel in the prior art.

Referring to FIGS. 1 to 3, the inventors have found that since a first fan-out sub-section extends in the first direction X, it would overlap the gate(s) of at least part of the thin film transistors in the display area in the thickness direction of the display panel. When a signal transition occurs in a scan signal received by the gate(s), the parasitic capacitance between the gate(s) and the first fan-out sub-section may cause abnormality in the data signal transmitted by the first fan-out sub-section, and thus in the data signal received by the light-emitting device. When the gate(s) receives a rising edge of the scan signal (signal transition), the light-emitting device dims down, and when the gate(s) receives a falling edge of the scan signal (signal transition), the light-emitting device lights up, thereby causing a "V" shaped display illumination abnormality.

Figure 19:
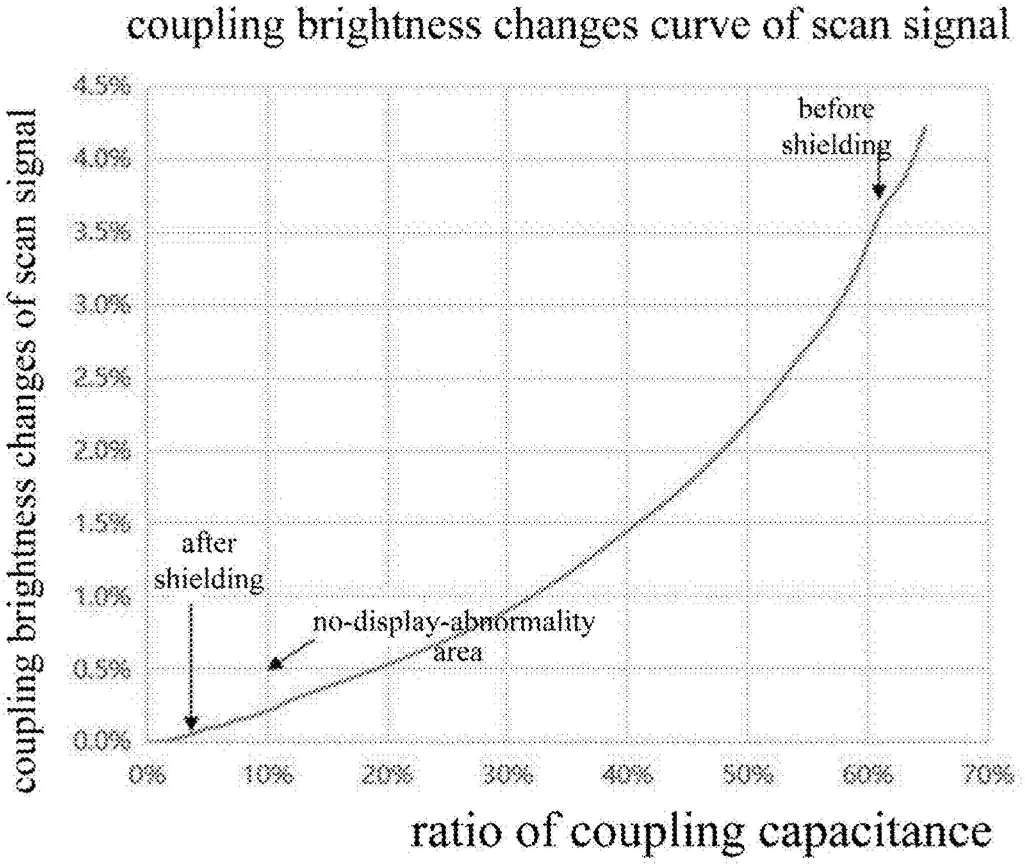
FIG. 19 is a diagram of results of ratio of coupling capacitances before and after a first shielding portion is provided according to an embodiment of the present application.

Referring to FIG. 19, the inventors have found that the parasitic capacitance between the first fan-out sub-section 106 and the first gate 105 can be effectively improved when a first shielding portion 108 is disposed between the first fan-out sub-section 106 and the first gate 105 which overlaps with the first fan-out sub-section 106 in the direction of thickness, and the spacing between the side of the first shielding portion 108 close to the first gate 105 and the side of the first gate 105 close to the first shielding portion 108 is greater than the spacing between the side of the first shielding portion 108 close to the first fan-out sub-section 106 and the side of the first fan-out sub-section 106 close to the first shielding portion 108, thus improving the abnormal display of the display panel 100.

Referring to FIG. 6, the spacing between the side of the first shielding portion 108 close to the first gate 105 and the side of the first gate 105 close to the first shielding portion 108 is d1, and the spacing between the side of the first shielding portion 108 close to the first fan-out sub-section 106 and the side of the first fan-out sub-section 106 close to the first shielding portion 108 is d2. The inventors have found that when a ratio of d1 to d2 is greater than 1 and the ratio of d1 to d2 is less than or equal to 5.5, for example, 1.5, 2, 2.5, 3, 3.5, 4, 4.5, 5, etc., it is possible to effectively avoid distortion of the scan signal received by the first gate 105 caused by a too large parasitic capacitance generated between the first shielding portion 108 and the first gate 105 while effectively reducing the parasitic capacitance between the first fan-out sub-section 106 and the first gate 105.

Figure 20:
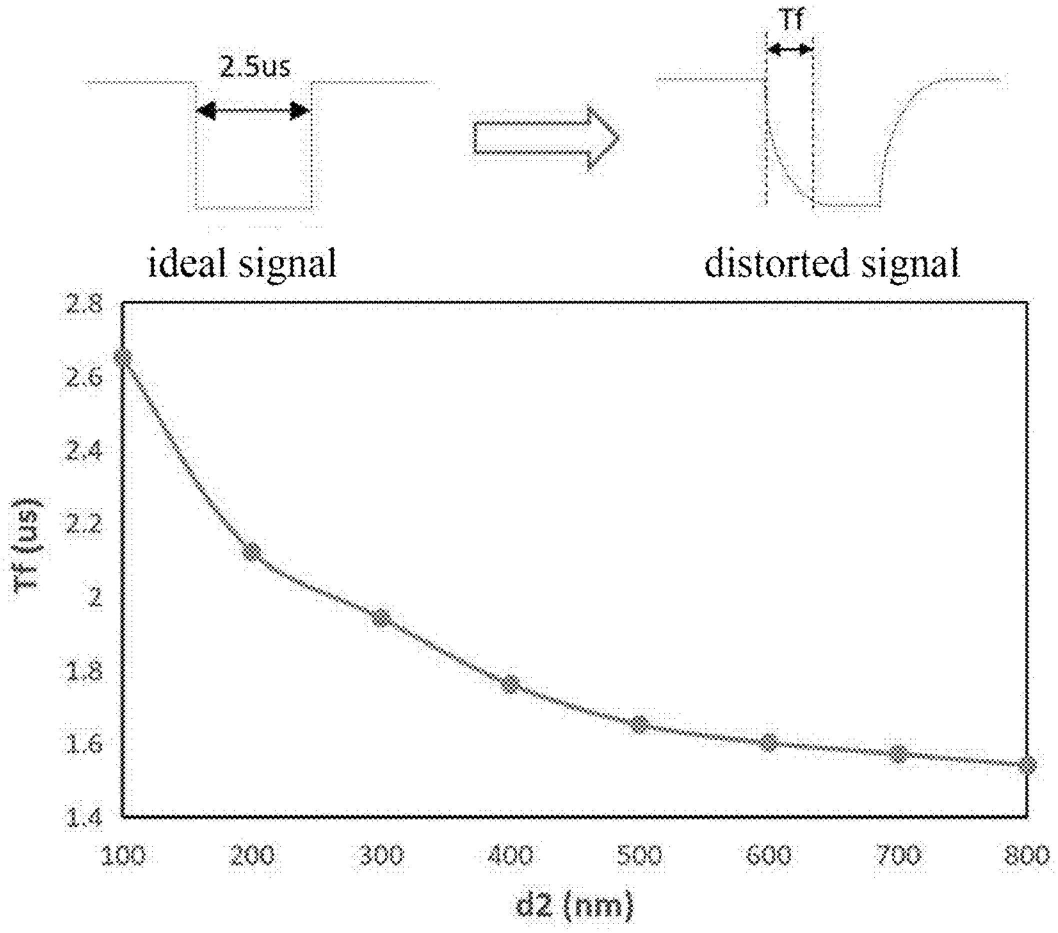
FIG. 20 is a schematic diagram showing spacing between a first gate and a first shielding portion and a degree of distortion of a scan signal received by the first gate according to an embodiment of the present application.
Figure 21:
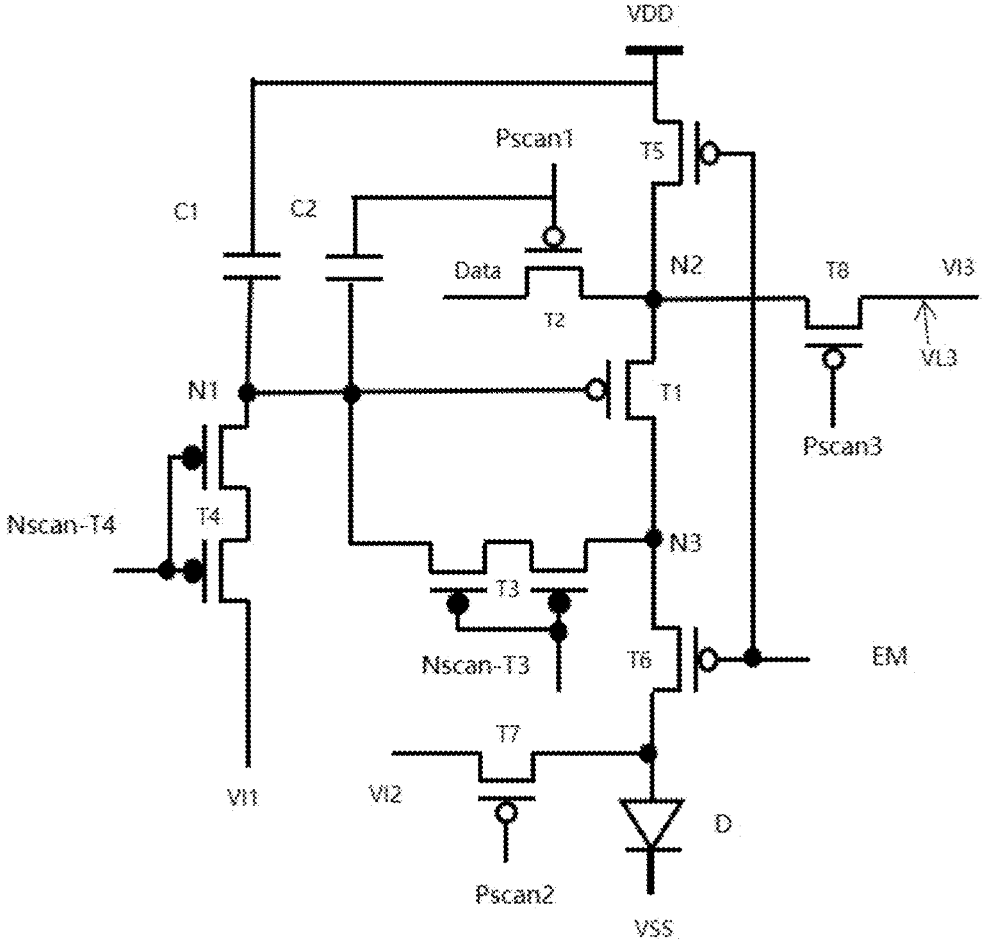
FIG. 21 is a schematic diagram showing structure of a pixel driving circuit according to an embodiment of the present application.

Referring to FIGS. 6 and 20, the inventors have found that when the spacing between the side of the first shielding portion 108 close to the first gate 105 and the side of the first gate 105 close to the first shielding portion 108 is less than 300 nm, the scan signal received by the first gate 105 is significantly distorted due to the too large parasitic capacitance generated between the first shielding portion 108 and the first gate 105, where Tf represents the fall time or rise time of the falling edge or rising edge of the signal.

Preferably, the spacing between the side of the first shielding portion 108 close to the first gate 105 and the side of the first gate 105 close to the first shielding portion 108 is greater than or equal to 300 nm, and the spacing between the side of the first shielding portion 108 close to the first gate 105 and the side of the first gate 105 close to the first shielding portion 108 is less than 1100 nm, for example, may be 400 nm, 500 nm, 600 nm, 700 nm, 800 nm, 900 nm, 1000 nm, or the like. The spacing between the side of the first shielding portion 108 close to the first fan-out sub-section 106 and the side of the first fan-out sub-section 106 close to the first shielding portion 108 is greater than 200 nm, and the spacing between the side of the first shielding portion 108 close to the first fan-out sub-section 106 and the side of the first fan-out sub-section 106 close to the first shielding portion 108 is less than 800 nm, for example, may be 300 nm, 400 nm, 500 nm, 600 nm, 700 nm, etc.

In some embodiments, in the thin film transistor layer 102, the first gate 105 is located within the first gate layer 142, the first gate layer 142 further comprising a first gate signal line connected to the first gate 105 to transmit a scan signal to the first gate 105. The orthographic projection of the first fan-out sub-section 106 on the substrate 101 and the orthographic projection of the first gate signal line on the substrate 101 have a second overlapping portion, i.e., the first fan-out sub-section 106 and the first gate signal line also overlap in the thickness direction of the display panel 100. The first conductor layer 107 further includes a second shielding portion whose orthographic projection on the substrate 101 at least partially overlaps the second overlapping portion so as to reduce parasitic capacitance between the first gate signal line and the first fan-out sub-section 106 and improve the display quality of the display panel 100.

In some embodiments, the orthographic projection of the second shielding portion on the substrate 101 covers the second overlapping portion, i.e., the second overlapping portion is located within the orthographic projection of the second shielding portion on the substrate 101 so that the second shielding portion can maximally reduce the parasitic capacitance between the first gate signal line and the first fan-out sub-section 106, improving the display quality of the display panel 100.

In some embodiments, the second shielding portion and the first shielding portion 108 form a shielding portion between the first gate layer 142 and the first fan-out sub-section 106. The first shielding portion 108 and the second shielding portion may be connected, that is, the first shielding portion 108 and the second shielding portion may be integrally provided.

Referring to FIGS. 8 to 21, in some embodiments, the display panel 100 includes a pixel driving circuit located within the display area AA. The pixel driving circuit including a light-emitting device D, and a first-type thin film transistor T1, a second-type thin film transistor T2, a third-type thin film transistor T3, a fourth-type thin film transistor T4, a fifth-type thin film transistor T5, a sixth-type thin film transistor T6, a seventh-type thin film transistor T7, and an eighth-type thin film transistor T8 located within the thin film transistor layer 102.

A source and a drain of the first-type thin film transistor T1 are electrically connected between the second node N2 and the third node N3, and a gate of the first-type thin film transistor T1 is electrically connected to the first node N1.

One of the source and the drain of the second-type thin film transistor T2 is electrically connected to the second node N2, the other of the source and the drain of the second-type thin film transistor T2 receives the data signal Data, and the gate of the second-type thin film transistor T2 receives the second scan signal Psan1.

The source and the drain of the third-type thin film transistor T3 are electrically connected between the first node N1 and the third node N3, and the gate of the third-type thin film transistor T3 receives the third scan signal Nscan-T3.

One of the source and the drain of the fourth-type thin film transistor T4 is electrically connected to the first node N1, the other of the source and the drain of the fourth-type thin film transistor T4 receives the first reset signal VI1, and the gate of the fourth-type thin film transistor T4 receives the first scan signal Nscan-T4.

The source and the drain of the fifth-type thin film transistor T5 are electrically connected between the first power supply terminal VDD and the second node N2, and the gate of the fifth-type thin film transistor T5 receives a light-emitting control signal EM.

The source and the drain of the sixth-type thin film transistor T6 are electrically connected between the third node N3 and the light-emitting device D. The gate of the sixth-type thin film transistor T6 receives the light-emitting control signal EM.

One of the source and the drain of the seventh-type thin film transistor T7 is electrically connected to the light-emitting device D. The other of the source and the drain of the seventh-type thin film transistor T7 receives the second reset signal VI2, and the gate of the seventh-type thin film transistor T7 receives the fourth scan signal Pscan2.

One of the source and the drain of the eighth-type thin film transistor T8 is electrically connected to the second node N2, the other of the source and the drain of the eighth-type thin film transistor T8 receives a third reset signal VI3, and the gate of the eighth-type thin film transistor T8 receives a fifth scan signal Pscan3.

In some embodiments, the first-type thin film transistor T1, the second-type thin film transistor T2, the fifth-type thin film transistor T5, the sixth-type thin film transistor T6, the seventh-type thin film transistor T7, and the eighth-type thin film transistor T8 are all selected from polysilicon thin film transistors, that is, the active layers of the above-mentioned thin film transistors comprise a polysilicon material. The third-type thin film transistor T3 and the fourth-type thin film transistor T4 are selected from metal oxide transistors, that is, the active layers of the thin film transistors include a metal oxide material.

In some embodiments, the first fan-out sub-section 106 overlaps the gate(s) of at least one of the seventh-type thin film transistor T7 or the eighth-type thin film transistor T8 in the thickness direction of the display panel 100 so that at least one of the seventh-type thin film transistor T7 or the eighth-type thin film transistor T8 is selected from the first thin film transistor(s) 103.

In some embodiments, one first fan-out sub-section 106 overlaps the gates of the seventh-type thin film transistor T7 and the eighth-type thin film transistor T8. The second shielding portion located between the first shielding portion 108 of the seventh-type thin film transistor T7 and the first shielding portion 108 of the eighth-type thin film transistor T8 is connected between the first shielding portion 108 of the seventh-type thin film transistor T7 and the first shielding portion 108 of the eighth-type thin film transistor T8.

The type of the third-type thin film transistor T3 and the type of the fourth-type thin film transistor T4 are of a different type from the other thin film transistors, and are selected from the second thin film transistors 115.

The first-type thin-film transistor T1, the second-type thin-film transistor T2, the fifth-type thin-film transistor T5, and the sixth-type thin-film transistor T6 may be selected from the first thin-film transistors 103, or the thin-film transistor layer 102 may further include a third thin-film transistor whose structure is similar to that of the first thin-film transistor 103, except that the first fan-out sub-section 106 does not overlap the gate of the third thin-film transistor in the thickness direction, so that the first shielding portion 108 is not provided in the third thin-film transistor.

In some embodiments, the light-emitting device D is electrically connected between the first power supply terminal VDD and the second power supply terminal VSS. The light-emitting device D may be selected from organic light-emitting diodes, submillimeter light-emitting diodes, miniature light-emitting diodes, and the like.

In some embodiments, the first-type thin film transistor T1 is a driving transistor configured to generate a driving current in a light-emitting stage according to a data signal Data written in a data writing stage to drive the light-emitting device D to emit light.

In some embodiments, the second-type thin film transistor T2 is a data transistor, one of the source or the drain of the second-type thin film transistor T2 is electrically connected to the second node N2. The other of the source or the drain of the second-type thin film transistor T2 is electrically connected to the data line 132. The data line 132 is configured to transmit the data signal Data, the gate of the second-type thin film transistor T2 is electrically connected to the first scan line, and the first scan line is configured to transmit the first scan signal Nscan-T4.

In some embodiments, the third-type thin film transistor T3 is a compensation transistor. The gate of the third-type thin film transistor T3 is electrically connected to a second scan line configured to transmit a second scan signal Psan1. The second scan signal Psan1 is different from the first scan signal Nscan-T4.

In some embodiments, the fourth-type thin film transistor T4 is a first reset transistor. One of the source and the drain of the fourth-type thin film transistor T4 is electrically connected to the first node N1, and the other of the source and the drain of the fourth-type thin film transistor T4 is electrically connected to a first reset line configured to transmit the first reset signal VI1. The gate of the fourth-type thin film transistor T4 is electrically connected to a third scan line configured to transmit a third scan signal Nscan-T3. The third scan signal Nscan-T3 is different from the first scan signal Nscan-T4 and the second scan signal Psan1.

In some embodiments, the fifth-type thin film transistor T5 is a first light-emitting control transistor. The gate of the fifth-type thin film transistor T5 is electrically connected to a light-emitting control line configured to transmit the light-emitting control signal EM. One of the source and the drain of the fifth-type thin film transistor T5 is electrically connected to the second node N2, and the other of the source and the drain of the fifth-type thin film transistor T5 is electrically connected to a first power supply signal line configured to transmit a first power supply signal from the first power supply terminal VDD.

In some embodiments, the sixth-type thin film transistor T6 is a second light-emitting control transistor. A gate of the sixth-type thin film transistor T6 is electrically connected to the light-emitting control line.

In some embodiments, the seventh-type thin film transistor T7 is a second reset transistor. One of the source and the drain of the seventh-type thin film transistor T7 is electrically connected to the light-emitting device D, the other of the source and the drain of the seventh-type thin film transistor T7 is electrically connected to a second reset line. The second reset line is configured to transmit the second reset signal VI2. The gate of the seventh-type thin film transistor T7 is electrically connected to the fourth scan line, which is configured to transmit the fourth scan signal Pscan2. The fourth scan signal Pscan2 is different from both the third scan signal Nscan-T3 and the second scan signal Psan1. The fourth scan signal Pscan2 is the same as or different from the first scan signal Nscan-T4.

In some embodiments, the eighth-type thin film transistor T8 is a third reset transistor. One of the source and the drain of the eighth-type thin film transistor T8 is electrically connected to the second node N2, the other of the source and the drain of the eighth-type thin film transistor T8 is electrically connected to a third reset line VL3 configured to transmit the third reset signal VI3. The gate of the eighth-type thin film transistor T8 is electrically connected to a fifth scan line configured to transmit a fifth scan signal Pscan3, which is the same as the fourth scan signal Pscan2, that is, the fifth scan line and the fourth scan line may be connected to one same scan signal port.

In some embodiments, the second-type of thin film transistor T2 and the third-type of thin film transistor T3 are configured to transmit a data signal Data to the first node N1 during a data writing stage.

In some embodiments, the pixel driving circuit further includes a first capacitor C1 connected in series with and between the first power supply terminal VDD and the first node N1.

In some embodiments, the pixel driving circuit further comprises a second capacitor C2 connected in series with and between the gate of the second-type thin film transistor T2 and the first node N1.

The operation principle of the pixel driving circuit is described below by taking the first-type thin film transistor T1, the second-type thin film transistor T2, the fifth-type thin film transistor T5, the sixth-type thin film transistor T6, the seventh-type thin film transistor T7, and the eighth-type thin film transistor T8 as P-type thin film transistors, and the third-type thin film transistor T3 and the fourth-type thin film transistor T4 as N-type thin film transistors as examples.

In a reset stage, the first scan signal Nscan-T4, the third scan signal Nscan-T3, and the light-emitting control signal EM are all at high-level, the second scan signal Psan1 is at low-level. The fourth-type thin film transistor T4 is turned on, and the first reset signal VI1 is transmitted to the first node N1 to reset the potential of the first node N1.

In a data writing stage, the second scan signal Psan1 and the light-emitting control signal EM are both at high-level. The first scan signal Nscan-T4 and the third scan signal Nscan-T3 are both at low-level. The second-type thin film transistor T2 and the third-type thin film transistor T3 are turned on, and the data signal Data is transmitted to the first node N1.

In some embodiments, at least one of the fourth scan signal Pscan2 or the fifth scan signal Pscan3 may have a low level during the reset stage and/or the data writing stage to turn on the seventh-type thin film transistor and/or the eighth-type thin film transistor, thereby causing the second reset signal VI2 and/or the third reset signal VI3 to be transmitted to the anode 134 of the light-emitting device D to reset the potential of the anode of the light-emitting device D.

In a node setting stage, the first scan signal Nscan-T4, and the fourth scan signal Pscan2, are all at high-level, the light-emitting control signal EM, the second scan signal Psan1, and the third scan signal Nscan-T3 are all at low-level. The first light-emitting control transistor T5 is turned on. Since the first-type thin film transistor T1 is in the ON state after the first node N1 receives the data signal Data, the first voltage signal supplied from the first voltage terminal may be transmitted to the second node N2 and the third node N3.

In a light-emitting stage, the first scan signal Nscan-T4 and the fourth scan signal Pscan2 are both at high-level, the light-emitting control signal EM, the second scan signal Psan1 and the third scan signal Nscan-T3 are all at low-level. The fifth-type thin film transistor T5 and the sixth-type thin film transistor T6 are turned on, and the first-type thin film transistor T1 generates a driving current to drive the light-emitting device D to emit light.

Figure 8:
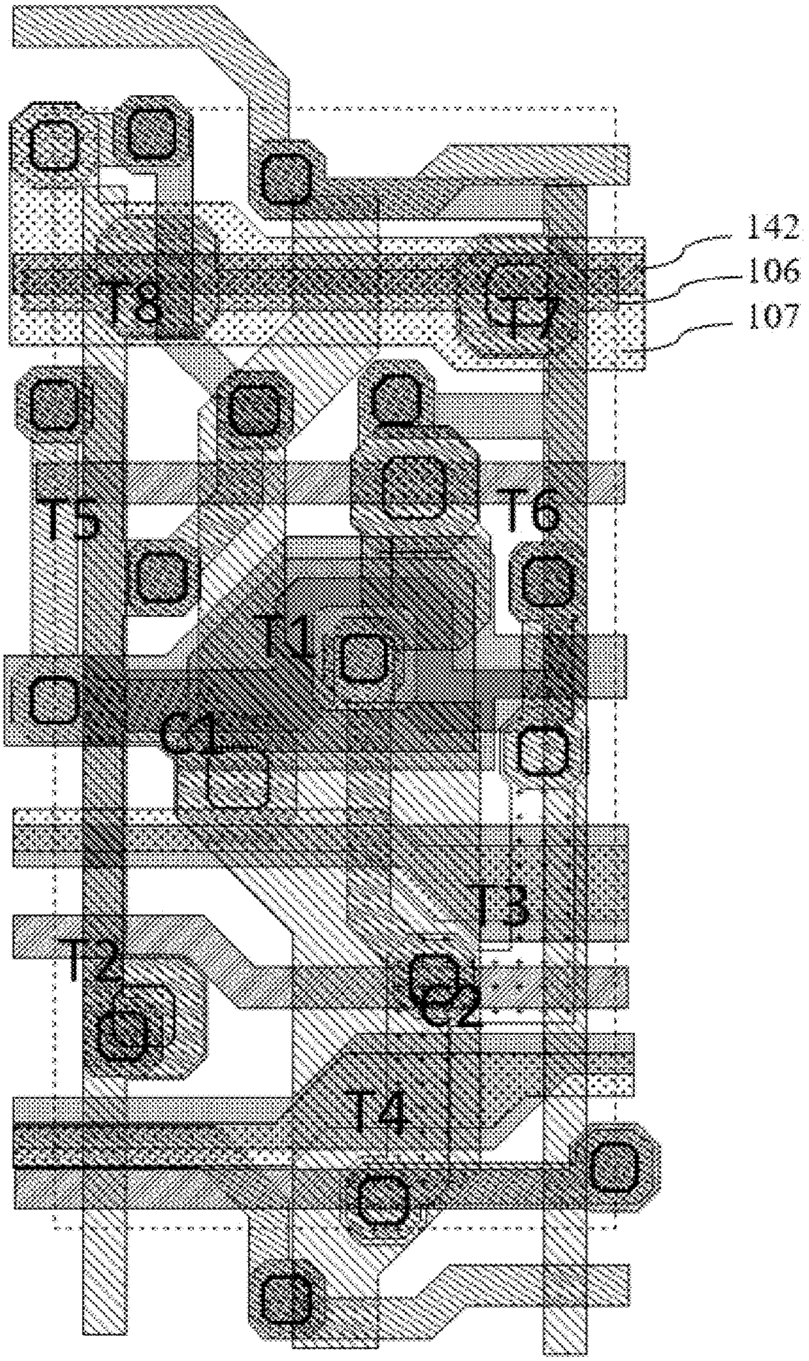
FIG. 8 is a schematic diagram showing structure of film layers of a pixel driving circuit of a display panel according to an embodiment of the present application.
Figure 9:
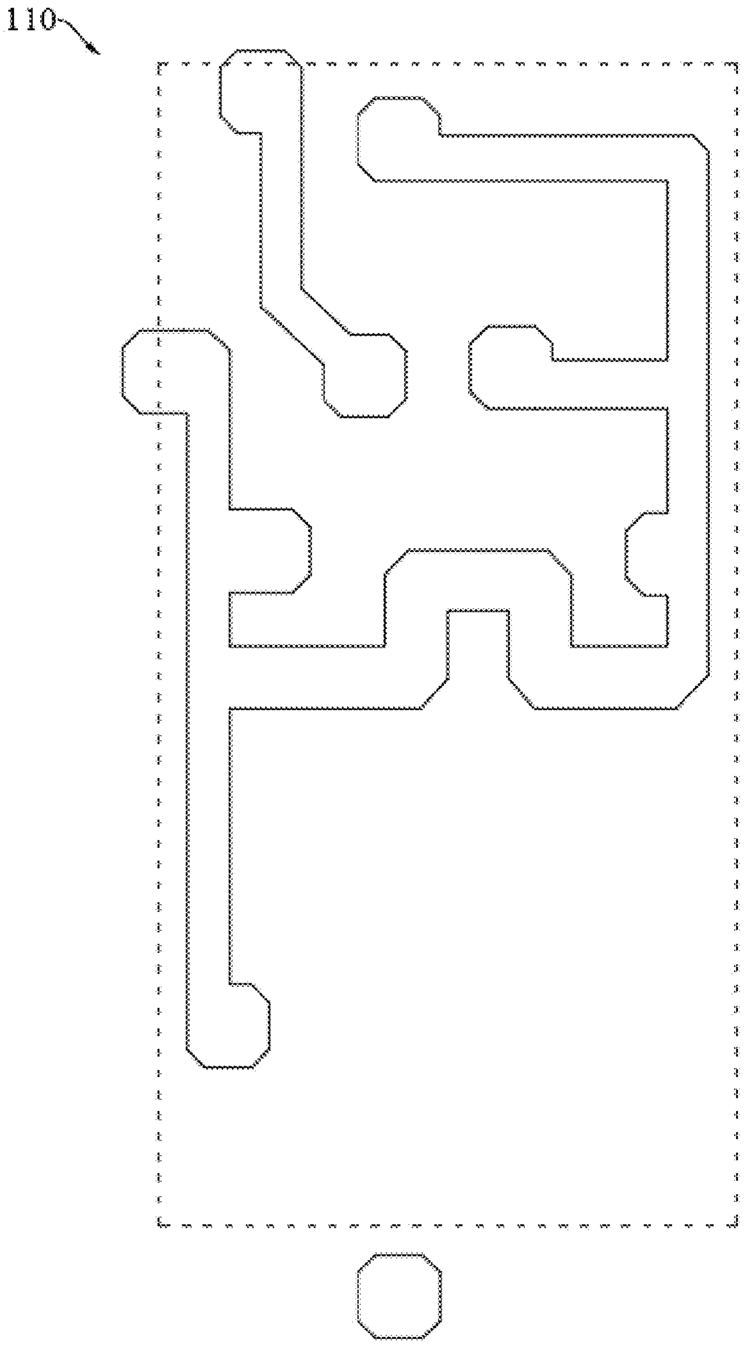
FIG. 9 is a schematic diagram showing structure of a first active layer of film layers of a display panel according to an embodiment of the present application.
Figure 10:
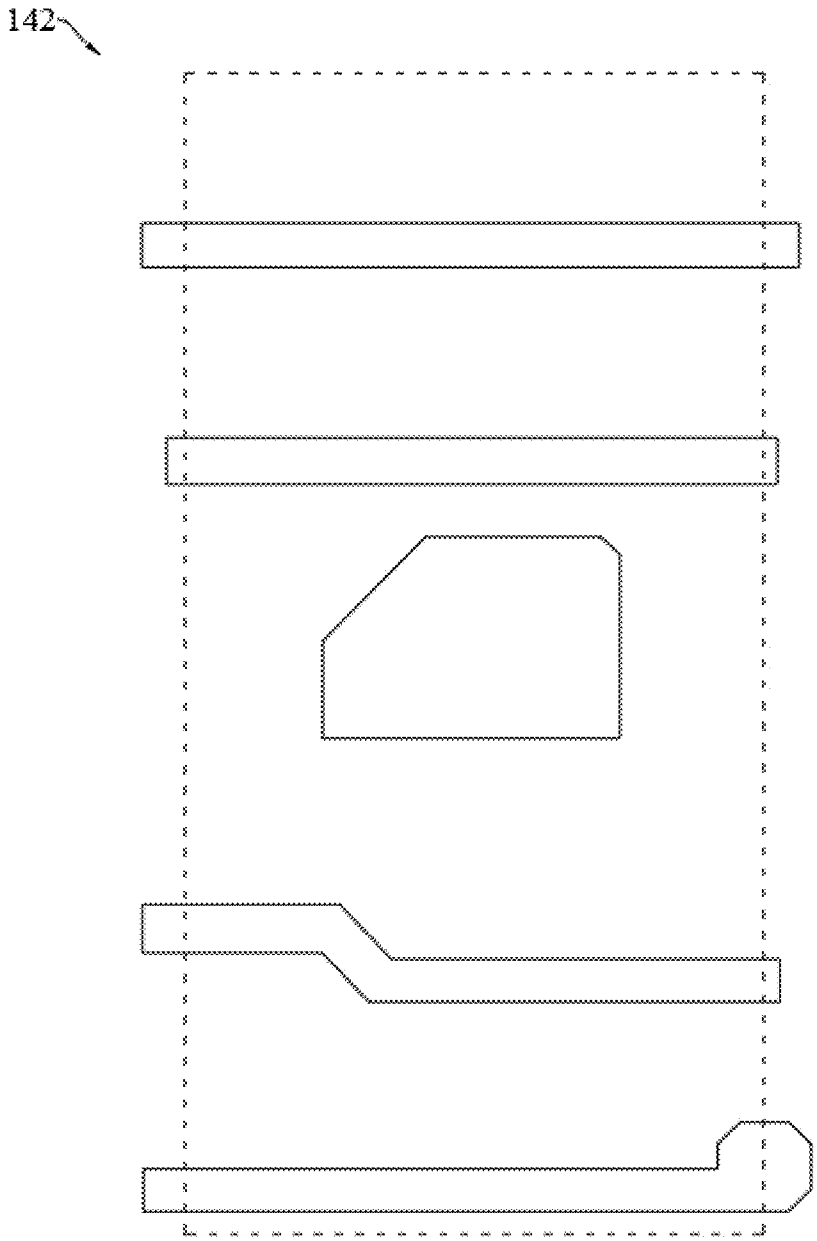
FIG. 10 is a schematic diagram showing structure of a first gate layer of film layers of a display panel according to an embodiment of the present application.

Referring to FIGS. 8 and 10, in some embodiments, the first scan line, the fourth scan line, the fifth scan line, the first reset line, and the light-emitting control line are all disposed in the same layer with the first gate 105, that is, the first scan line, the fourth scan line, the fifth scan line, the first reset line, and the light-emitting control line are all located in the first gate layer 142.

Figure 11:
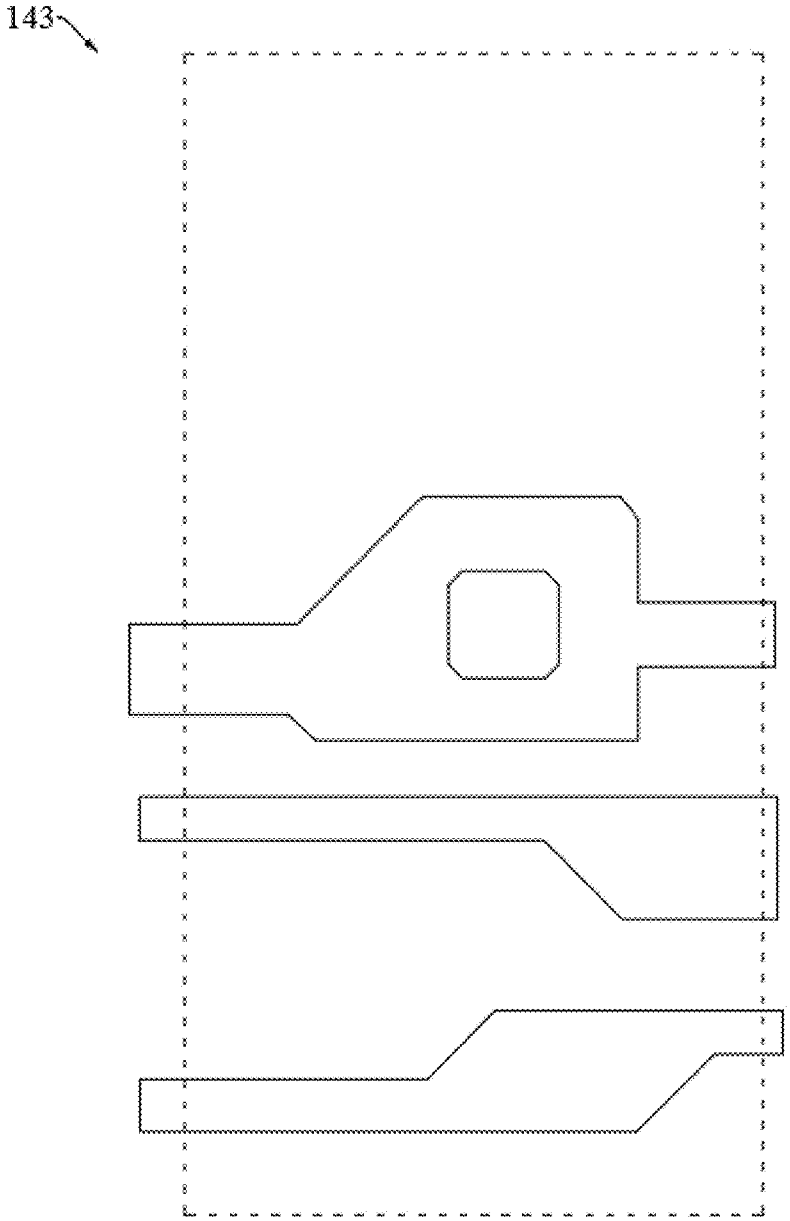
FIG. 11 is a schematic diagram showing structure of a third conductor layer of film layers of a display panel according to an embodiment of the present application.
Figure 12:
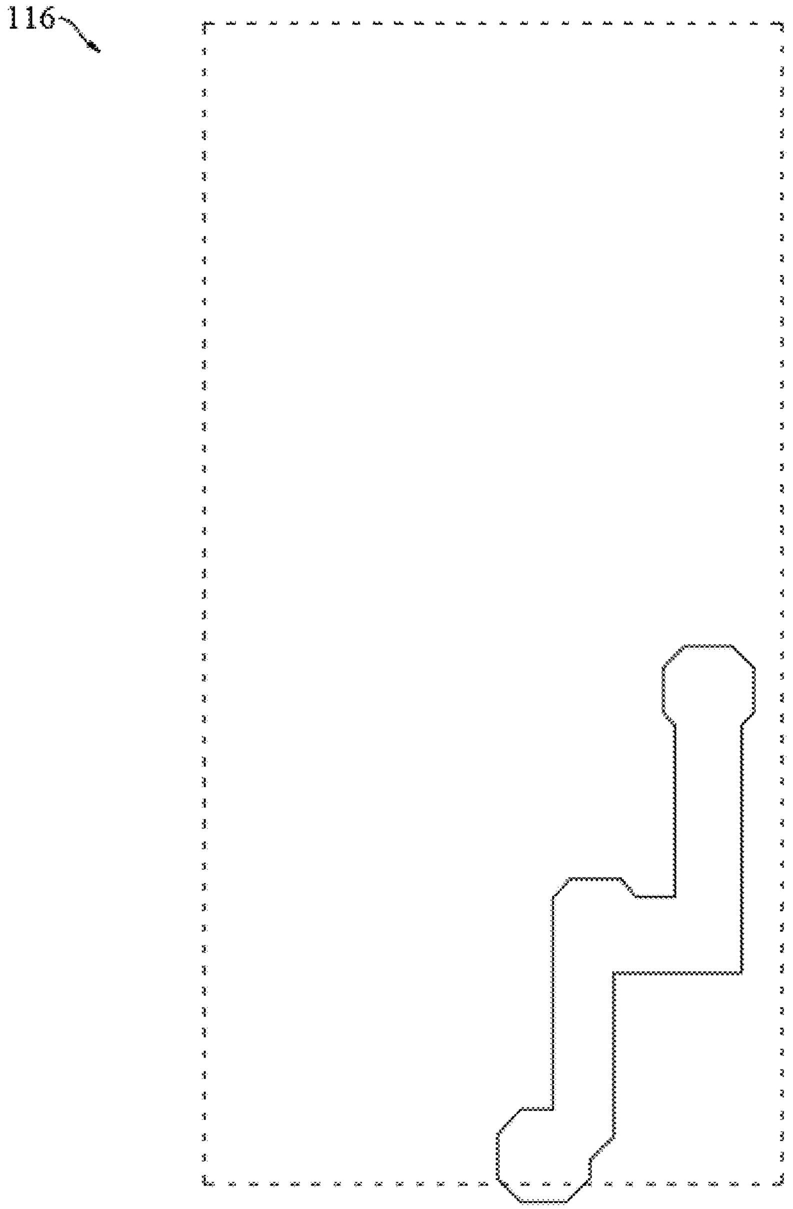
FIG. 12 is a schematic diagram showing structure of a second active layer of film layers of a display panel according to an embodiment of the present application.

Referring to FIG. 8, FIG. 11, and FIG. 13, in some embodiments, each of the third-type thin film transistor T3 and the fourth-type thin film transistor T4 is a dual-gate thin film transistor. And each of the third-type thin film transistor T3 and the fourth-type thin film transistor T4 is selected from the second thin film transistor 115. The second scan line is partly provided in the same layer with the second gate 117. The second scan line is partly provided in the same layer with the third gate 122 (i.e., the second scan line is partly located in the third conductor layer 143), the third scan line is partly provided in the same layer with the second gate 117. And the third scan line is partly provided in the same layer with the third gate 122 (i.e., the third scan line is partly located in the third conductor layer 143).

Figure 14:
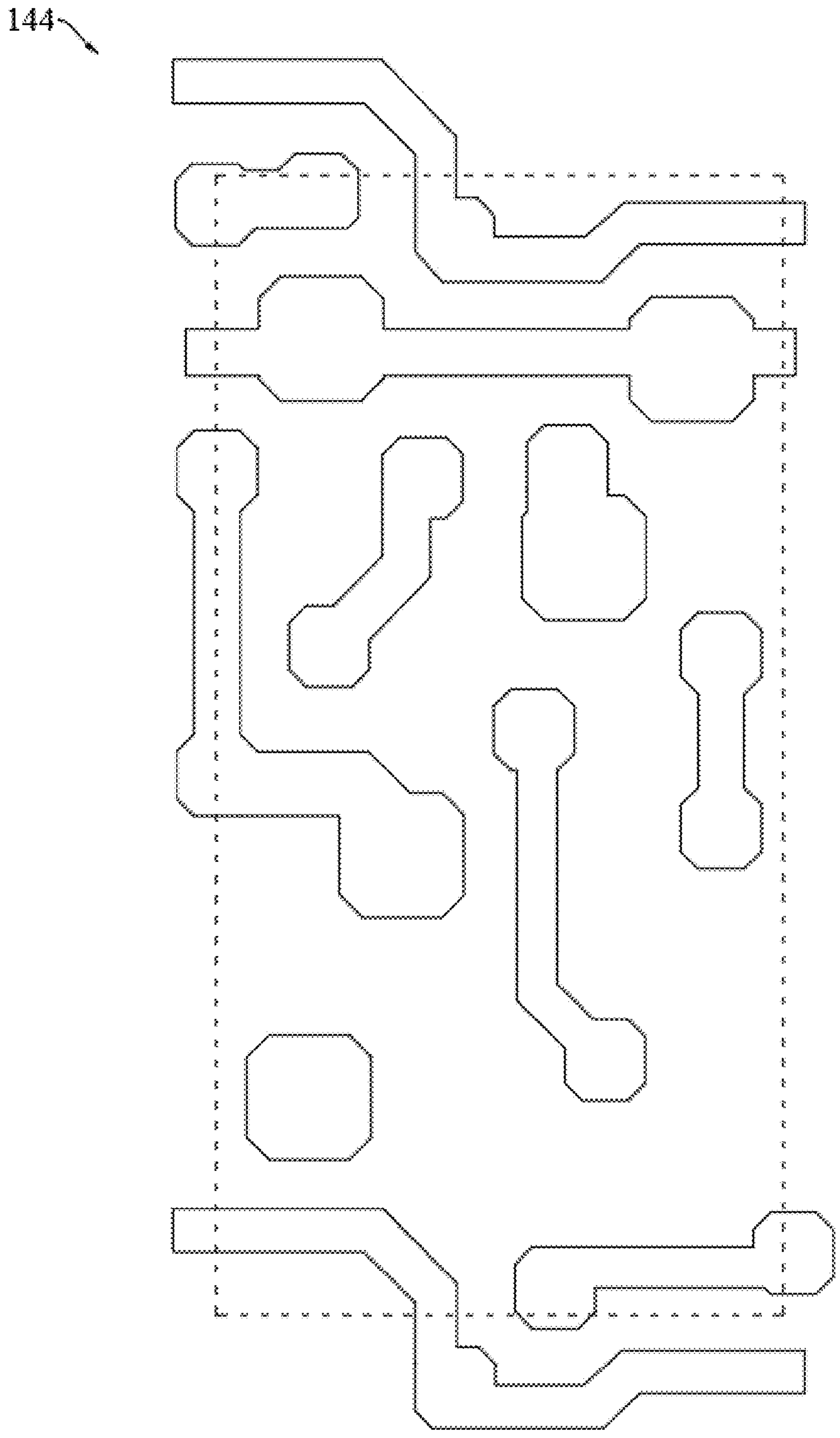
FIG. 14 is a schematic diagram showing structure of a first metal layer of film layers of a display panel according to an embodiment of the present application.

Referring to FIGS. 8 and 14, in some embodiments, the second reset line is disposed in the same layer of the first metal layer 144 as the first fan-out sub-section 106, the first source-drain layer 111, and the second source-drain layer 118.

Referring to FIGS. 8 and 15, in some embodiments, the first power supply signal line, the data line 132, and the second fan-out sub-section 133 are all located in the second conductor layer 140.

Referring to FIGS. 8 and 13, in some embodiments, the third reset line VL3 is disposed in the same layer as the first shielding portion 108 and the second gate 117, that is, the third reset line VL3 is located in the first conductor layer 107, and the third reset line VL3 transmits the third reset signal VI3. The first shielding portion 108 is connected to the third reset signal port so as to obtain a constant voltage signal.

In some embodiments, the substrate 101 may be a hard substrate, such as a glass substrate. Alternatively, the substrate 101 may be a flexible substrate, e.g., the substrate 101 may be a substrate formed of polyimide. When the substrate 101 is a flexible substrate, the substrate 101 includes a first flexible sub-substrate, an intermediate layer, an adhesive layer, and a second flexible sub-substrate. The first flexible sub-substrate and the second flexible sub-substrate may be formed of the same material such as polyimide. The intermediate layer may be formed of an inorganic material including, for example, at least one of SiOx and SiNx, and the adhesive layer may be formed of hydrogenated amorphous silicon (a-Si:H).

Referring to FIGS. 4 and 5, in some embodiments, the display panel 100 further includes a buffer layer 136 between the substrate 101 and the thin film transistor layer 102, which may include one or more inorganic insulating layers including materials such as silicon oxide or silicon nitride. The buffer layer 136 may provide a planarization layer on the upper surface of the substrate 101, and may stop or prevent impurities and moisture from permeating into the light-emitting layer from the substrate 101. Specifically, the buffer layer 136 includes a first sub-buffer layer formed of, for example, silicon nitride and a second sub-buffer layer formed of, for example, silicon oxide. The second sub-buffer layer and the first sub-buffer layer may be formed of silicon nitride having the same film quality (e.g., the same density and the same film stress), and an oxide film may be positioned at an interface between the second sub-buffer layer and the first sub-buffer layer. In practical applications, the thickness of the first sub-buffer layer may be from 50 nm to 100 nm, and the thickness of the second sub-buffer layer may be from 100 nm to 300 nm.

Referring to FIGS. 4 and 5, in some embodiments, the display panel 100 further includes a pixel definition layer 138 located on the side of the planarization layer 135 away from the substrate 101, the pixel definition layer 138 including a pixel definition portion and a pixel definition opening, and the light-emitting device is located within the pixel definition opening.

Referring to FIGS. 4 and 5, in some embodiments, the display panel further includes a spacer post 139 located on one side of the pixel defining portion away from the substrate 101. The spacer post 139 is used to be interposed between a mask and the light-emitting device layer in a photomasking process of the light-emitting device layer to avoid scratching from affecting the product quality of the display panel.

In some embodiments, the display panel 100 further includes an encapsulation layer that covers the light-emitting device layer. The encapsulation layer may be formed by alternately laminating one or more organic layers and one or more inorganic layers. It may be provided with a plurality of inorganic layers or organic layers. Each organic layer is formed of a polymer, and may be, for example, a laminated layer or a monolayer formed of any of polyethylene terephthalate, polyimide, polycarbonate, epoxy resin, polyethylene, and polyacrylate. The organic layer may be formed from polyacrylate, specifically includes materials obtained by polymerizing a monomer composition including a diacrylate-based monomer and a triacrylate-based monomer. The monomer composition may also include a monoacrylate-based monomer. In addition, the monomer composition may also include, but is not limited to well-known photoinitiators. The inorganic layer may be a laminated layer or a monolayer including a metal oxide or metal nitride. For example, the inorganic layer may include any of SiNx, $Al_2O_3$, $SiO_2$, and $TiO_2$. The encapsulation layer may sequentially include a first inorganic encapsulation layer, a first organic encapsulation layer, and a second inorganic encapsulation layer on the cathode in a direction away from the substrate 101. Further, the encapsulation layer may sequentially include a first inorganic encapsulation layer, a first organic encapsulation layer, a second inorganic encapsulation layer, a second organic encapsulation layer, and a third inorganic encapsulation layer on the cathode in a direction away from the substrate 101. Further, the encapsulation layer may sequentially include a first inorganic encapsulation layer, a first organic encapsulation layer, a second inorganic encapsulation layer, a second organic encapsulation layer, a third inorganic encapsulation layer, a third organic encapsulation layer, and a fourth inorganic encapsulation layer on the cathode in a direction away from the substrate 101.

In some embodiments, the display panel 100 may further include a touch layer located on one side of the encapsulation layer away from the substrate 101. And the touch layer may allow for a touch function in self-capacitance mode h or mutual capacitance mode. When the touch layer implements a touch function in a self-capacitance mode, the touch layer may have only one touch metal layer. When the touch layer implements a touch function in a mutual capacitance mode, the touch layer includes a first touch metal layer, a touch insulating layer, and a second touch metal layer, where the touch insulating layer is located on one side of the first touch metal layer away from the first insulating layer 123, and the second touch metal layer is located on one side of the touch insulating layer away from the first insulating layer 123. The first touch metal layer may be disposed directly on the encapsulation layer, or a spacer layer may be disposed between the first touch layer and the encapsulation layer. And the spacer layer may include an inorganic spacer layer and/or an organic spacer layer. The first touch metal layer includes a first touch electrode, a second touch electrode, and a first bridge connection line. The second touch metal layer includes a second bridge connection line, and both the first touch electrode and the second touch electrode are metal meshes. Alternatively, the second touch metal layer includes a first touch electrode, a second touch electrode, and a first bridge connection line. And the first touch metal layer includes a second bridge connection line.

In some embodiments, the display panel 100 further includes a polarizer layer on one side of the touch layer away from the substrate 101, and a cover plate layer on one side of the polarizer layer away from the substrate 101. The cover plate layer may be a flexible cover plate. The display panel 100 may also include a corresponding adhesive layer between the polarizing layer and the cover plate layer.

According to the embodiments of the present application, the parasitic capacitance between the first gate 105 and the first fan-out sub-section 106 is reduced by the arrangement of the first shielding portion 108. At the same time, the spacing between the first gate 105 and the side of the first shielding portion 108 close to the first gate 105 is relatively large, so that the signal received by the first gate 105 is prevented from being interfered with by the parasitic capacitance between the first shielding portion 108 and the first gate 105, thereby improving the display quality of the display panel 100.

Figure 22:
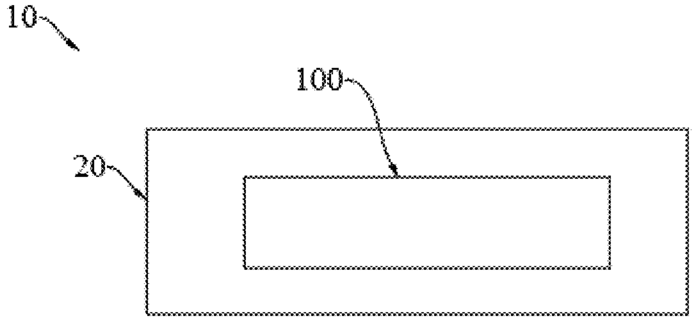
FIG. 22 is a schematic diagram showing structure of a display device according to an embodiment of the present application.

Referring to FIG. 22, an embodiment of the present invention further provides a display device 10 including a display panel 100 as described above and a device body 20, the device body 20 being integrated with the display panel 100.

For the specific structure of the display panel 100, one may refer to any one of the above-described embodiments of the display panel 100 and the accompanying drawings, and details are not described herein.

In this embodiment, the device body 20 may include a middle frame, a frame glue, and the like. And the display device 10 may be a display terminal such as a mobile phone, a tablet, or a television, which is not limited herein.

Embodiments of the present application disclose a display panel and a display device, the display panel including a substrate, a thin film transistor layer including a first thin film transistor, a first conductor layer, and a fan-out trace, where an orthographic projection of a first fan-out sub-section of the fan-out trace and a first gate of the first thin film transistor on the substrate has a first overlapping portion. The orthographic projection of the first conductor layer on the substrate at least partially overlaps the first overlapping portion. A spacing between one side of the first shielding portion close to the first gate and the first gate is larger than a spacing between one side of the first shielding portion close to the first fan-out sub-section and the first fan-out sub-section. With the first shielding portion, a parasitic capacitance between the first gate and the first fan-out sub-section is reduced, and a spacing between the side of the first shielding portion close to the first gate and the first gate is set larger, so that a parasitic capacitance between the first shielding portion and the first gate is prevented from interfering with a signal received by the first gate. The display quality of the display panel is improved.

It will be appreciated by those of ordinary skill in the art that equivalent substitutions or alterations may be made on the basis of the technical solutions of the present application and the idea of its invention, and that all such alterations or substitutions shall fall within the scope of protection of the claims annexed to this application.

What is claimed is:

1. A display panel comprising a display area, the display panel comprising:

a substrate;

a thin film transistor layer located on one side of the substrate and comprising first thin film transistors located in the display area, second thin film transistors located in the display area, and fan-out traces located in the display area, and the second thin film transistors being electrically connected to the first thin film transistors;

wherein each first thin film transistor comprises a first gate and a first source-drain layer, and each second thin film transistor comprises a second gate;

wherein each fan-out trace comprises a first fan-out sub-section located on one side of the first gate away from the substrate, the first fan-out sub-section and the first source-drain layer are disposed in a same layer, and an orthographic projection of the first fan-out sub-section on the substrate and an orthographic projection of the first gate on the substrate have a first overlapping portion;

wherein the thin film transistor layer further comprises a first conductor layer located between the first gate and the first fan-out sub-section, each first thin film transistor further comprises a first shielding portion located in the first conductor layer, an orthographic projection of the first shielding portion on the substrate at least partially overlaps the first overlapping portion, and the second gate and the first shielding portion are disposed in another same layer; and wherein a spacing between one side of the first shielding portion close to the first gate and one side of the first gate close to the first shielding portion is greater than a spacing between one side of the first shielding portion close to the first fan-out sub-section and one side of the first fan-out sub-section close to the first shielding portion.

2. The display panel according to claim 1, wherein the first overlapping portion is located in the orthographic projection of the first shielding portion on the substrate.

3. The display panel according to claim 2, wherein the first shielding portion is electrically connected to a constant voltage signal port of the display panel.

4. The display panel according to claim 1, wherein a ratio of the spacing between the side of the first shielding portion close to the first gate and the side of the first gate close to the first shielding portion and the spacing between the side of the first shielding portion close to the first fan-out sub-section and the side of the first fan-out sub-section close to the first shielding portion is greater than 1; and the ratio of the spacing between the side of the first shielding portion close to the first gate and the side of the first gate close to the first shielding portion and the spacing between the side of the first shielding portion close to the first fan-out sub-section and the side of the first fan-out sub-section close to the first shielding portion is less than or equal to 5.5.

5. The display panel according to claim 4, wherein the spacing between the side of the first shielding portion close to the first gate and the side of the first gate close to the first shielding portion is greater than or equal to 300 nm, and the spacing between the side of the first shielding portion close to the first gate and the side of the first gate close to the first shielding portion is less than or equal to 1100 nm; and the spacing between the side of the first shielding portion close to the first fan-out sub-section and the side of the first fan-out sub-section close to the first shielding portion is greater than or equal to 200 nm, and the spacing between the side of the first shielding portion close to the first fan-out sub-section and the side of the first fan-out sub-section close to the first shielding portion is less than or equal to 800 nm.

6. The display panel according to claim 1, further comprising a plurality of data lines located in the display area, the data lines being connected to the first fan-out sub-sections;

each fan-out trace further comprises a second fan-out sub-section, the first fan-out sub-section extends in a first direction, the second fan-out sub-section extends in a second direction, each data line extends in the second direction, and the first direction intersects the second direction; and the second fan-out sub-section is located on one side of the first fan-out sub-section away from the substrate.

7. The display panel according to claim 6, wherein the data lines and the first fan-out sub-sections are disposed in a same layer.

8. The display panel according to claim 6, wherein the plurality of data lines are connected with the fan-out traces on a one-to-one basis.

9. The display panel according to claim 1, wherein each first thin film transistor further comprises a first active layer, the first active layer is located on one side of the first gate close to the substrate;

the thin film transistor layer further comprises a first insulating layer and a second insulating layer, the first insulating layer is disposed between the first gate and the first conductor layer, and the second insulating layer is disposed between the first conductor layer and the first fan-out sub-section; and a thickness of the first insulating layer is greater than a thickness of the second insulating layer.

10. The display panel according to claim 9, wherein each second thin film transistor further comprises a second active layer, a third gate, and a second source-drain layer, wherein the second active layer is located on one side of the first active layer away from the substrate, the second source-drain layer and the first source-drain layer are disposed in a same layer, and the third gate is located on one side of the second active layer close to the substrate.

11. The display panel according to claim 10, wherein the first insulating layer comprises a first insulating sub-layer, a second insulating sub-layer, and a third insulating sub-layer, the first insulating sub-layer being located between the first gate and the third gate, the second insulating sub-layer being located between the third gate and the second active layer, and the third insulating sub-layer being located between the second active layer and the first conductor layer.

12. The display panel according to claim 9, further comprising a light-emitting device layer on one side of the first source-drain layer away from the substrate, the light-emitting device layer comprising a light-emitting device comprising an anode; and the display panel further comprising a second conductor layer located between the first source-drain layer and the light-emitting device layer, the second conductor layer comprising a transition portion, the anode being connected to the transition portion, the first source-drain layer comprising a first source and a first drain, and the transition portion being connected to the first source or the first drain.

13. The display panel according to claim 12, wherein the second fan-out sub-sections of the fan-out traces are located in the second conductor layer.

14. The display panel according to claim 1, wherein the thin film transistor layer comprises a first-type thin film transistor, a second-type thin film transistor, a third-type thin film transistor, a fourth-type thin film transistor, a fifth-type thin film transistor, a sixth-type thin film transistor, a seventh-type thin film transistor, and an eighth-type thin film transistor located in the display area;

a source and a drain of the first-type thin film transistor are electrically connected between a second node and a third node, and a gate of the first-type thin film transistor is electrically connected to a first node;

one of a source and a drain of the second-type thin film transistor is electrically connected to the second node, another of the source and the drain of the second-type thin film transistor receives a data signal, and a gate of the second-type thin film transistor receives a first scan signal;

a source and a drain of the third-type thin film transistor are electrically connected between the first node and the third node, and a gate of the third-type thin film transistor receives a second scan signal;

one of a source and a drain of the fourth-type thin film transistor is electrically connected to the first node, another of the source and the drain of the fourth-type thin film transistor receives a first reset signal, and a gate of the fourth-type thin film transistor receives a third scan signal;

a source and a drain of the fifth-type thin film transistor are electrically connected between a first power supply terminal and the second node, and a gate of the fifth-type thin film transistor receives a light-emitting control signal;

a source and a drain of the sixth-type thin film transistor are electrically connected between the third node and a light-emitting device, and a gate of the sixth-type thin film transistor receives the light-emitting control signal;

one of a source and a drain of the seventh-type thin film transistor is electrically connected to the light-emitting device, another of the source and the drain of the seventh-type thin film transistor receives a second reset signal, and a gate of the seventh-type thin film transistor receives a fourth scan signal;

one of a source and a drain of the eighth-type thin film transistor is electrically connected to the second node, another of the source and the drain of the eighth-type thin film transistor receives a third reset signal, and a gate of the eighth-type thin film transistor receives a fifth scan signal; and wherein at least one of the seventh-type thin film transistor or the eighth-type thin film transistor is selected from the first thin film transistors and at least one of the third-type thin film transistor or the fourth-type of thin film transistor is selected from the second thin film transistors.

15. The display panel according to claim 14, wherein the one of the source and the drain of the eighth-type thin film transistor is electrically connected to the second node, the other of the source and the drain of the eighth-type thin film transistor is electrically connected to a third reset line, and the third reset line is configured to transmit a third reset signal; and the third reset line and the first shielding portion are disposed in a same layer.

16. A display device comprising a display panel, the display panel comprising:

a substrate;

a thin film transistor layer located on one side of the substrate and comprising first thin film transistors located in the display area, second thin film transistors located in the display area and fan-out traces located in the display area, and the second thin film transistors being electrically connected to the first thin film transistors;

wherein each first thin film transistor comprises a first gate and a first source-drain layer, and each second thin film transistor comprises a second gate;

wherein each fan-out trace comprises a first fan-out sub-section located on one side of the first gate away from the substrate, wherein the first fan-out sub-section and the first source-drain layer are disposed in a same layer, an orthographic projection of the first fan-out sub-section on the substrate and an orthographic projection of the first gate on the substrate have a first overlapping portion;

wherein the thin film transistor layer further comprises a first conductor layer located between the first gate and the first fan-out sub-section, each first thin film transistor further comprises a first shielding portion located in the first conductor layer, an orthographic projection of the first shielding portion on the substrate at least partially overlaps the first overlapping portion, and the second gate and the first shielding portion are disposed in another same layer; and wherein a spacing between one side of the first shielding portion close to the first gate and one side of the first gate close to the first shielding portion is greater than a spacing between one side of the first shielding portion close to the first fan-out sub-section and one side of the first fan-out sub-section close to the first shielding portion.

17. The display device according to claim 16, wherein the first overlapping portion is located in the orthographic projection of the first shielding portion on the substrate.

18. The display device according to claim 17, wherein the first shielding portion is electrically connected to a constant voltage signal port of the display panel.

19. The display device according to claim 16, wherein a ratio of the spacing between the side of the first shielding portion close to the first gate and the side of the first gate close to the first shielding portion and the spacing between the side of the first shielding portion close to the first fan-out sub-section and the side of the first fan-out sub-section close to the first shielding portion is greater than 1; and the ratio of the spacing between the side of the first shielding portion close to the first gate and the side of the first gate close to the first shielding portion and the spacing between the side of the first shielding portion close to the first fan-out sub-section and the side of the first fan-out sub-section close to the first shielding portion is less than or equal to 5.5.

20. The display device according to claim 19, wherein the spacing between the side of the first shielding portion close to the first gate and the side of the first gate close to the first shielding portion is greater than or equal to 300 nm, and the spacing between the side of the first shielding portion close to the first gate and the side of the first gate close to the first shielding portion is less than or equal to 1100 nm; and the spacing between the side of the first shielding portion close to the first fan-out sub-section and the side of the first fan-out sub-section close to the first shielding portion is greater than or equal to 200 nm, and the spacing between the side of the first shielding portion close to the first fan-out sub-section and the side of the first fan-out sub-section close to the first shielding portion is less than or equal to 800 nm.

* * * * *